(12) United States Patent
Hosaka

(10) Patent No.: US 11,929,369 B2
(45) Date of Patent: Mar. 12, 2024

(54) ELECTRONIC DEVICE DAM WALLS LOCATED BETWEEN TWO ADJACENT CONDUCTIVE WIRES

(71) Applicant: InnoLux Corporation, Miao-Li County (TW)

(72) Inventor: Shuhei Hosaka, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 103 days.

(21) Appl. No.: 17/143,114

(22) Filed: Jan. 6, 2021

(65) Prior Publication Data
US 2022/0216240 A1    Jul. 7, 2022

(51) Int. Cl.
| | |
|---|---|
| *H01L 27/12* | (2006.01) |
| *G02F 1/1335* | (2006.01) |
| *G02F 1/1339* | (2006.01) |
| *G02F 1/1345* | (2006.01) |
| *G02F 1/1362* | (2006.01) |
| *H01L 23/057* | (2006.01) |
| *H01L 25/16* | (2023.01) |
| *H01L 27/15* | (2006.01) |
| *H10K 50/842* | (2023.01) |
| *H10K 59/131* | (2023.01) |
| *H10K 59/38* | (2023.01) |

(52) U.S. Cl.
CPC .......... *H01L 27/124* (2013.01); *H01L 23/057* (2013.01); *G02F 1/133514* (2013.01); *G02F 1/1339* (2013.01); *G02F 1/13458* (2013.01); *G02F 1/136286* (2013.01); *H01L 25/167* (2013.01); *H01L 27/156* (2013.01); *H10K 50/8428* (2023.02); *H10K 59/131* (2023.02); *H10K 59/38* (2023.02)

(58) Field of Classification Search
CPC ....................... G02F 1/13458; G02F 1/136286
See application file for complete search history.

(56) References Cited

U.S. PATENT DOCUMENTS

| | | | |
|---|---|---|---|
| 6,433,852 B1 * | 8/2002 | Sonoda | ............ G02F 1/134363 349/141 |
| 2017/0082900 A1 * | 3/2017 | Kong | .................. G02F 1/13452 |

FOREIGN PATENT DOCUMENTS

TW        I291056        12/2007

* cited by examiner

*Primary Examiner* — Lauren Nguyen
(74) *Attorney, Agent, or Firm* — Winston Hsu

(57) ABSTRACT

An electronic device includes a first substrate including a first surface and a first side-surface adjacent to the first surface, a second substrate including a second surface and a second side-surface adjacent to the second surface, a plurality of first conductive wires disposed on the first surface, a plurality of dam walls disposed on the first surface and located between any adjacent two of the first conductive wires respectively and a plurality of second conductive wires disposed on the first side-surface and the second side-surface. The plurality of first conductive wires are electrically connected to the plurality of second conductive wires respectively.

13 Claims, 11 Drawing Sheets

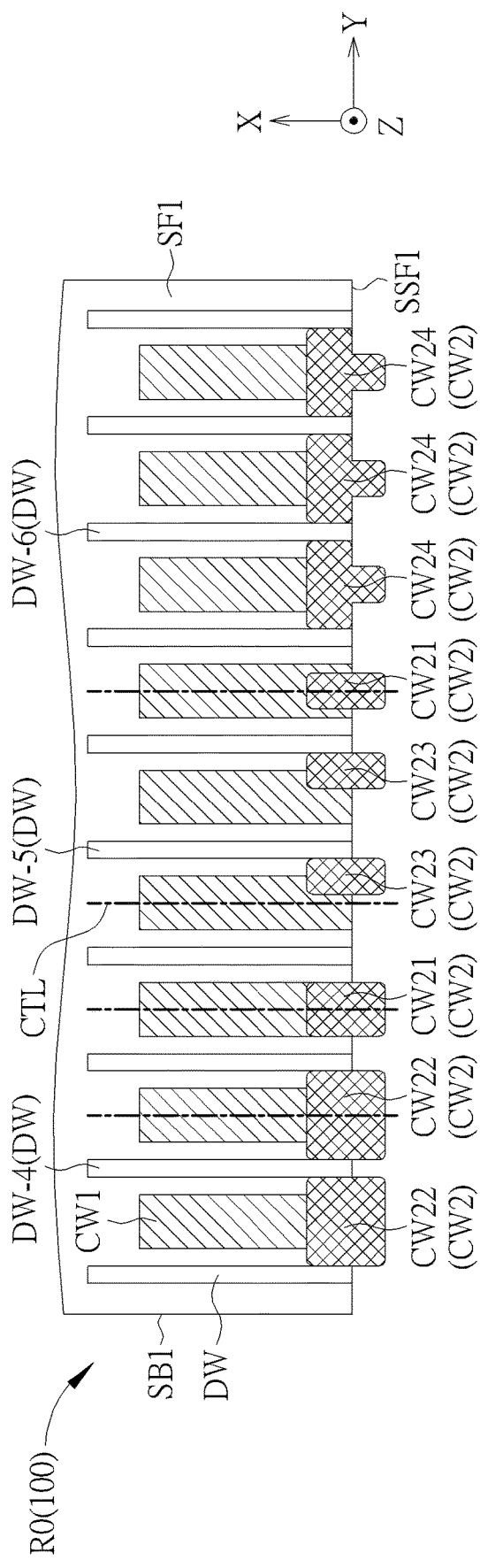
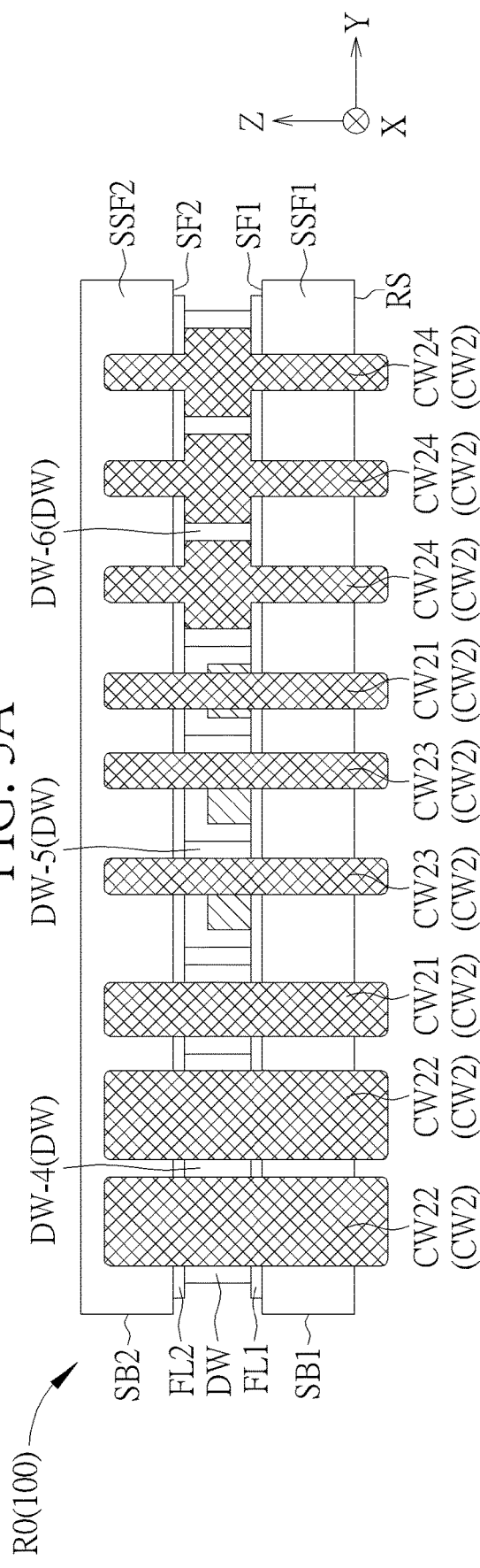
FIG. 3A
FIG. 3B

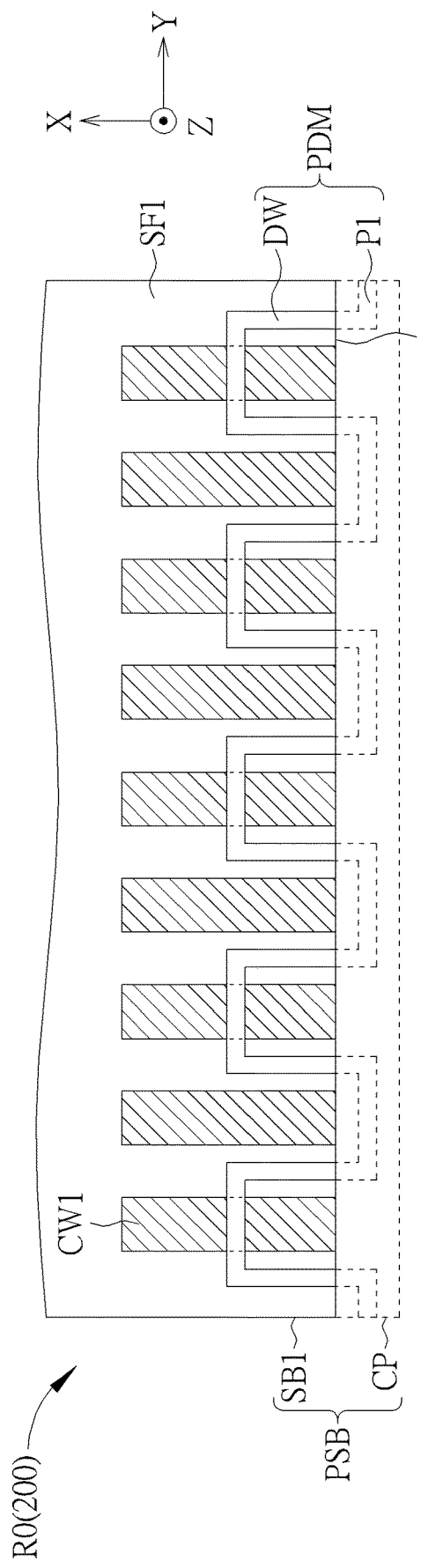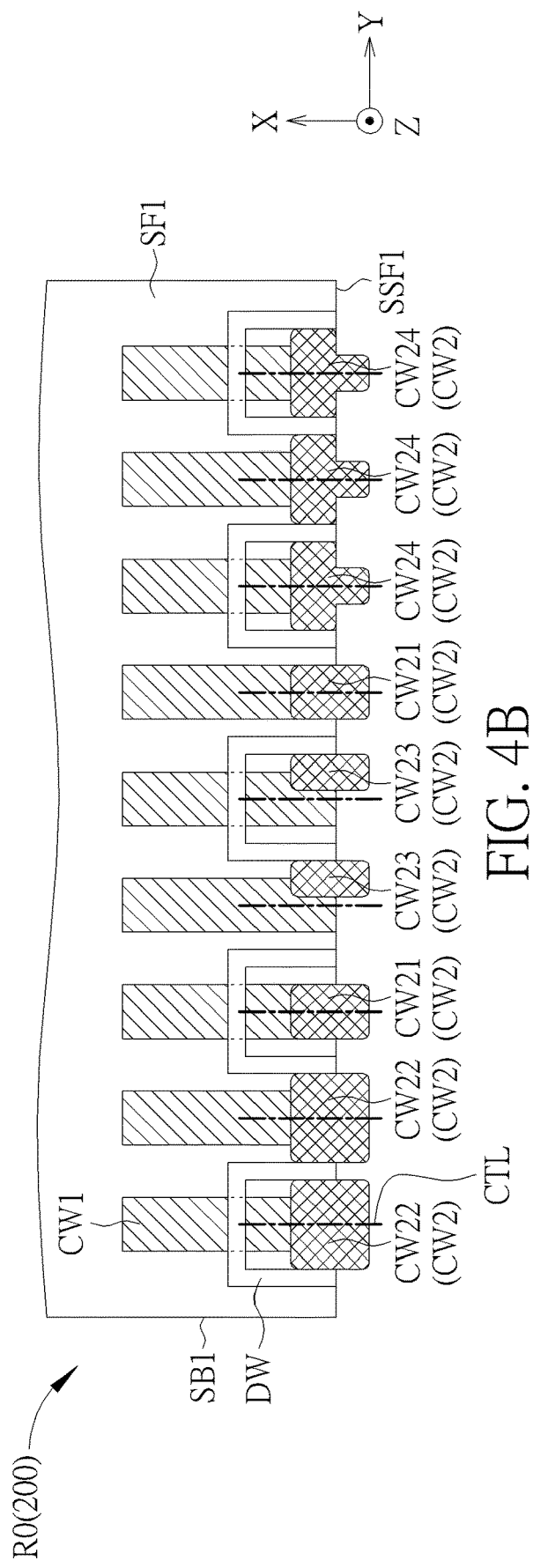

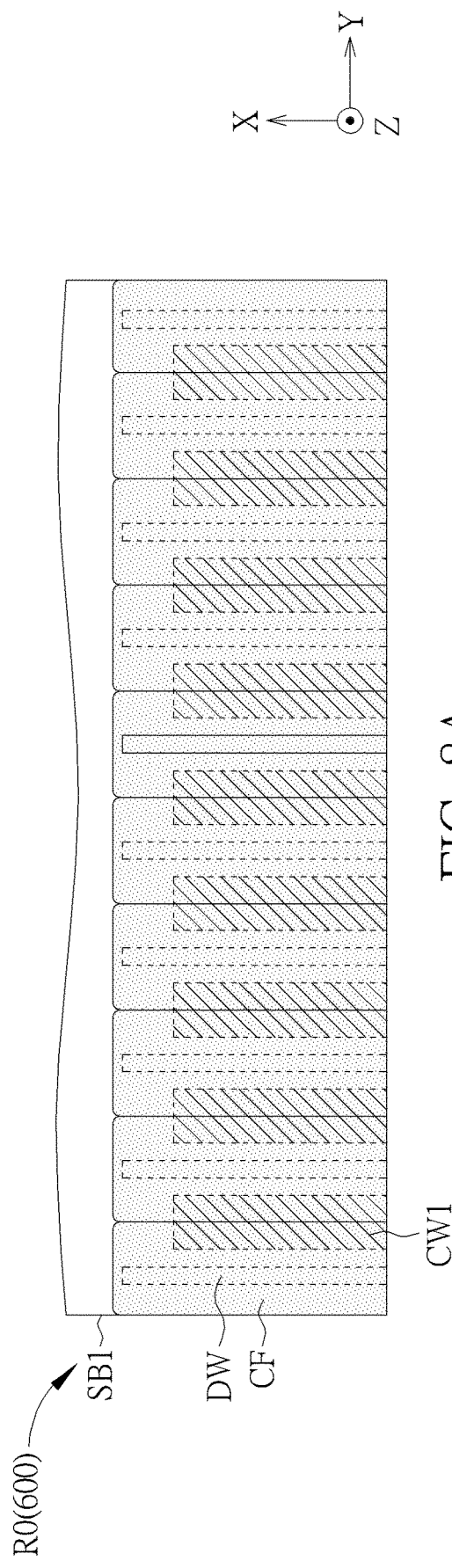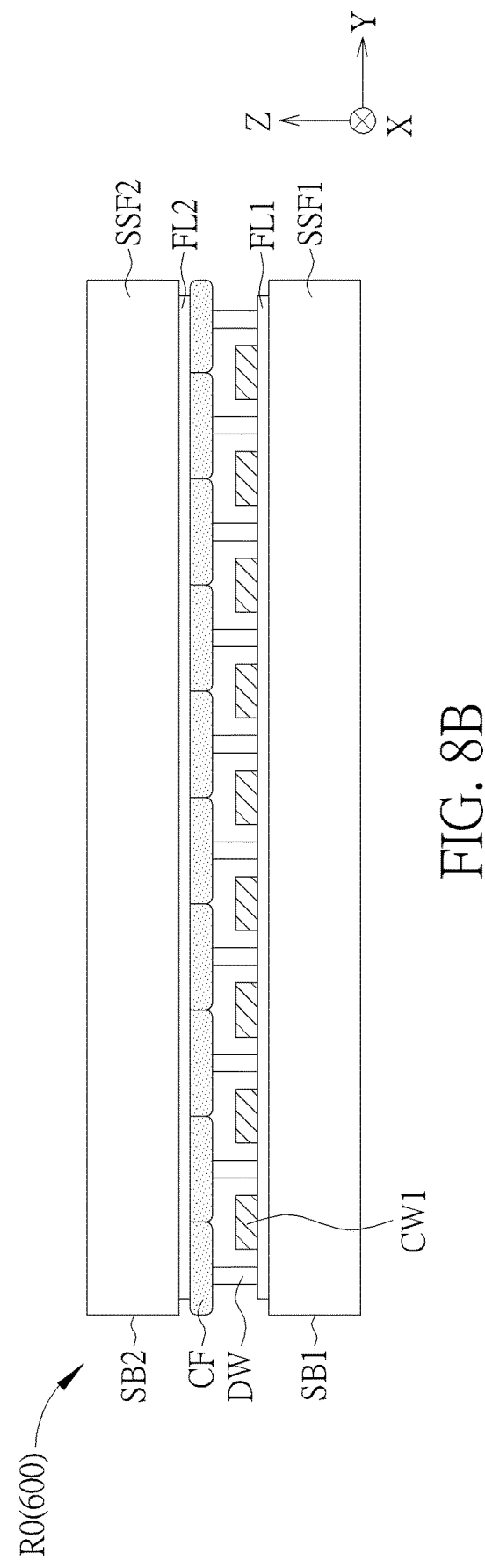
FIG. 8A
FIG. 8B

ELECTRONIC DEVICE DAM WALLS LOCATED BETWEEN TWO ADJACENT CONDUCTIVE WIRES

BACKGROUND OF THE DISCLOSURE

1. Field of the Disclosure

The present disclosure relates to an electronic device, and more particularly to an electronic device having a dam wall structure.

2. Description of the Prior Art

Electronic devices having border free characteristics have become one of the topics in the new generation of electronic technology recently. However, in the manufacturing process of the border free electronic devices, problems such as a short between the conductive wires may occur, thereby reducing the quality of the electronic device. Therefore, to improve the manufacturing process of the border free electronic device is one of the directions of the development in the related field.

SUMMARY OF THE DISCLOSURE

An electronic device is provided by the present disclosure, wherein the electronic device includes a dam wall structure to reduce the short between the conductive wires, thereby improving the quality of the electronic device.

In some embodiments, an electronic device is provided by the present disclosure. The electronic device includes a first substrate including a first surface and a first side-surface adjacent to the first surface, a second substrate including a second surface and a second side-surface adjacent to the second surface, a plurality of first conductive wires disposed on the first surface, a plurality of dam walls disposed on the first surface and located between any adjacent two of the first conductive wires respectively and a plurality of second conductive wires disposed on the first side-surface and the second side-surface. The plurality of first conductive wires are electrically connected to the plurality of second conductive wires respectively. A distance between adjacent two of the plurality of dam walls is less than a width of the plurality of second conductive wires.

In some embodiments, an electronic device is provided by the present disclosure. The electronic device includes a first substrate including a first surface and a first side-surface adjacent to the first surface, a second substrate including a second surface and a second side-surface adjacent to the second surface, a plurality of first conductive wires disposed on the first surface, a plurality of first dam walls disposed on the first side-surface and the second side-surface and located between any adjacent two of the plurality of second conductive wires respectively and a plurality of second conductive wires disposed on the first side-surface and the second side-surface. The plurality of first conductive wires are electrically connected to the plurality of second conductive wires respectively.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 3A schematically illustrates a partial top view of the first substrate of the electronic device in a side printing process according to the first embodiment of the present disclosure.

FIG. 3B schematically illustrates a partial side view of the electronic device in a side printing process according to the first embodiment of the present disclosure.

FIG. 4A schematically illustrates a partial top view of the first substrate of an electronic device according to a second embodiment of the present disclosure.

FIG. 4B schematically illustrates a partial top view of the first substrate of the electronic device in a side printing process according to the second embodiment of the present disclosure.

FIG. 8A schematically illustrates a partial top view of the first substrate of an electronic device according to a sixth embodiment of the present disclosure.

FIG. 8B schematically illustrates a partial side view of the electronic device according to the sixth embodiment of the present disclosure.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
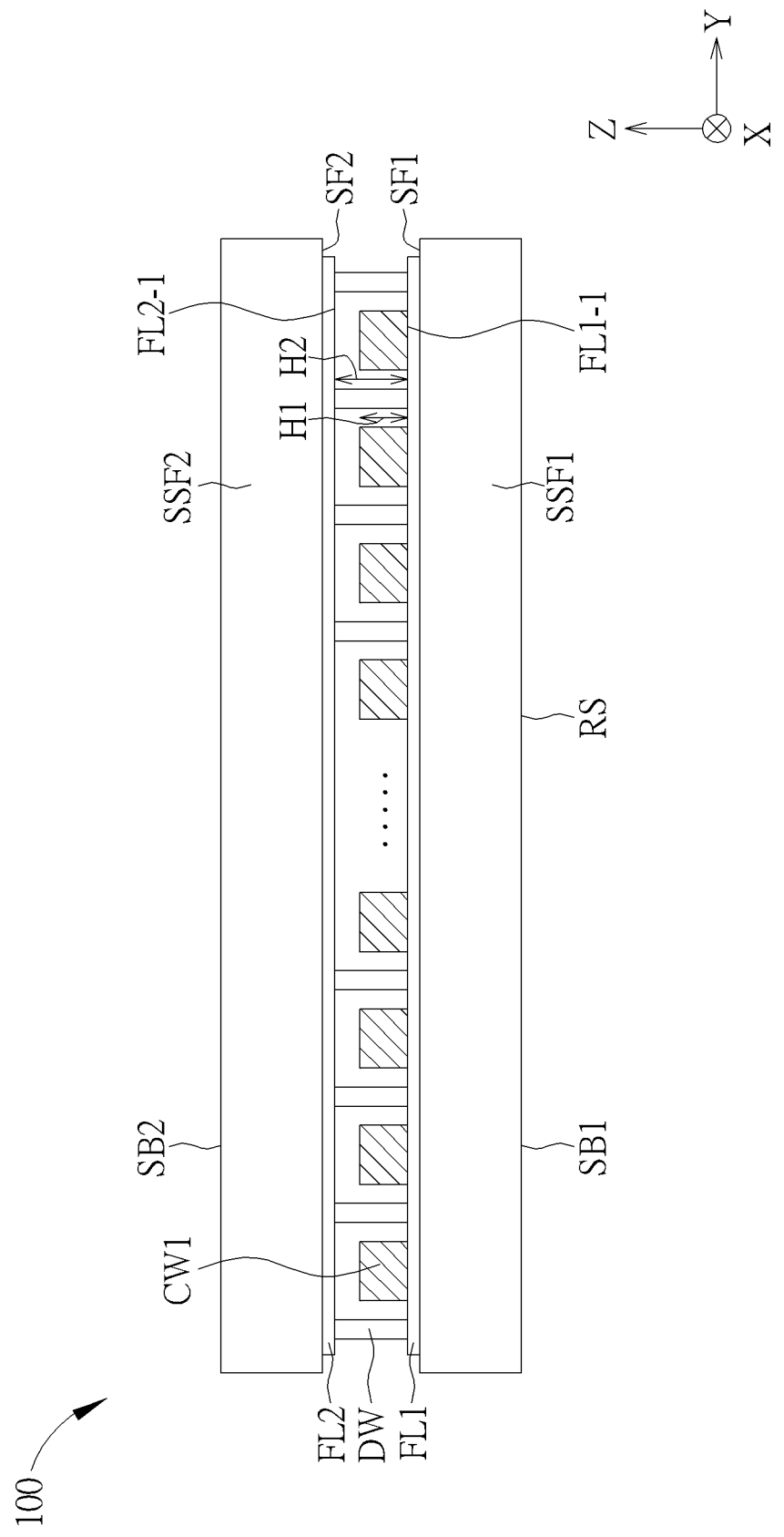
FIG. 1 schematically illustrates a cross-sectional view of an electronic device according to a first embodiment of the present disclosure.
Figure 2:
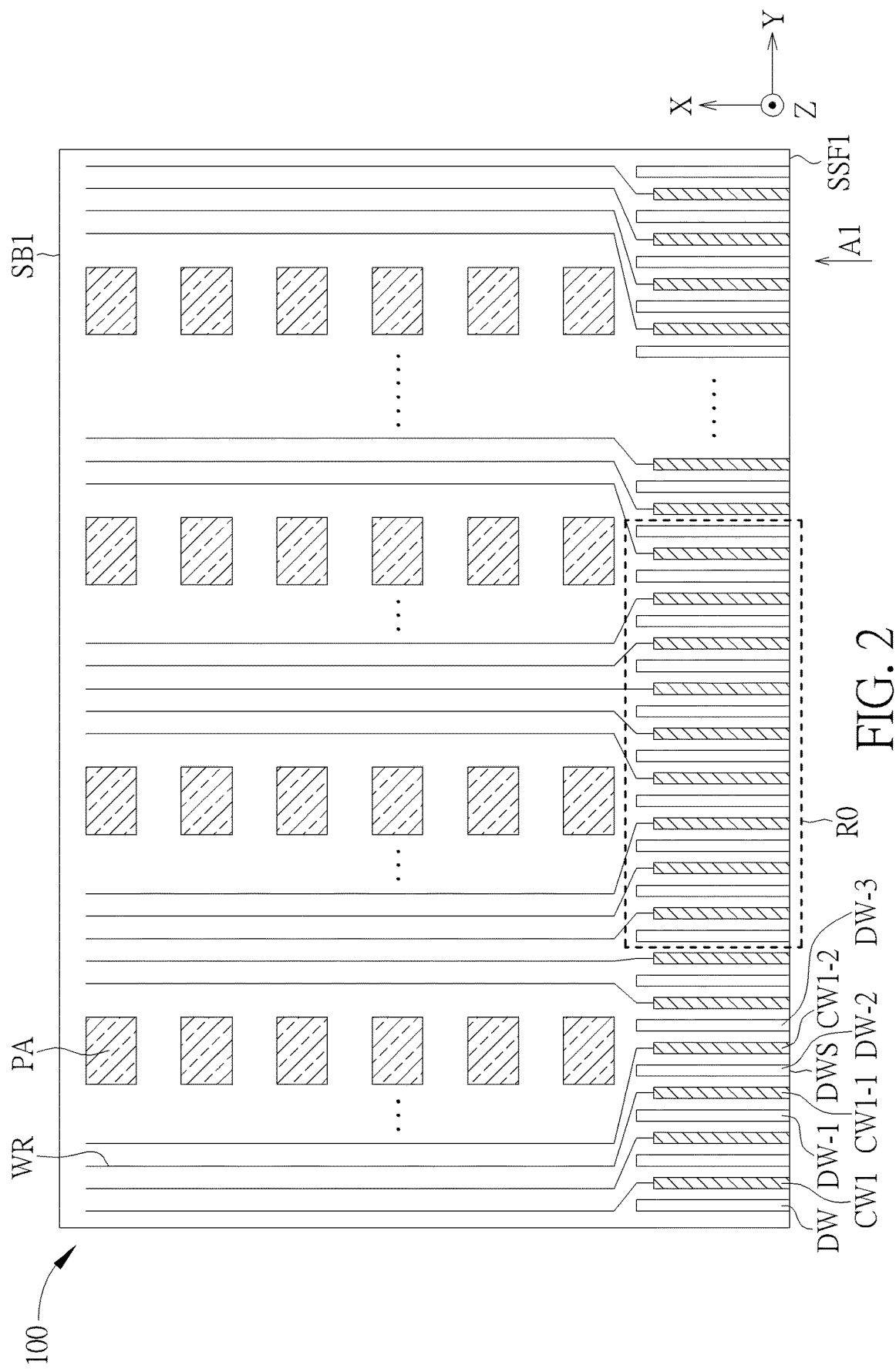
FIG. 2 schematically illustrates a top view of the first substrate of the electronic device according to the first embodiment of the present disclosure.

Referring to FIG. 1 and FIG. 2, FIG. 1 schematically illustrates a cross-sectional view of an electronic device according to a first embodiment of the present disclosure, and FIG. 2 schematically illustrates a top view of the first substrate of the electronic device according to the first embodiment of the present disclosure. It should be noted that the cross-sectional view of the electronic device 100 shown in FIG. 1 may be observed from the arrow A1 shown in FIG. 2, but not limited thereto. As shown in FIG. 1 and FIG. 2, an electronic device 100 is provided by the present disclosure, wherein the electronic device 100 may for example include a laptop, public display, tiled display, vehicle display, touch display, television, surveillance camera, smart phone, tablet, light source module, lighting device or the electronic devices applied to the above-mentioned products, but not limited thereto. In some embodiments, the electronic device 100 may not include display function and may include an antenna or sensing device such as a liquid crystal antenna, but not limited thereto. In the following embodiments, a display device is taken as an example of the electronic device 100 for description, but the present disclosure is not limited thereto. In the present embodiment, as shown in FIG. 1, the electronic device 100 may include a first substrate SB1, a second substrate SB2, a first functional layer FL1 and a second functional layer FL2, but not limited thereto. The first substrate SB1 has a first surface SF1, a first side-surface SSF1 adjacent to the first surface SF1, and an outer surface RS opposite to the first surface SF1. For example, the first side-surface SSF1 is located between the first surface SF1 and the outer surface RS. The second substrate SB2 has a second surface SF2 and a second side-surface SSF2 adjacent to the second surface SF2. For example, the second surface SF2 may connect to the second side-surface SSF2. The first substrate SB1 and the second substrate SB2 are disposed opposite to each other and may include rigid substrates or flexible substrates, wherein the rigid substrate may include glass, quartz, sapphire, ceramic, other suitable materials or the combinations of any the above-mentioned materials, and the flexible substrate may include polyimide (PI) substrate, polycarbonate (PC) substrate, polyethylene terephthalate (PET) substrate, other suitable substrates or the combinations of the above-mentioned substrates, but not limited thereto. The first functional layer FL1 may be disposed on the first substrate SB1. Specifically, the first functional layer FL1 is disposed on the first surface SF1 (i.e., an inner surface) of the first substrate SB1. The first functional layer FL1 of the present embodiment may include a plurality of driving elements and/or driving circuits (such as thin film transistor (TFT) elements) electrically connected to the light emitting elements of the electronic device 100 to drive the light emitting elements, but not limited thereto. For example, when the electronic device 100 is a light emitting diode display device, the electronic device 100 may include a plurality of light emitting diodes serving as the light emitting elements, and the driving elements and/or the driving circuits of the first functional layer FL1 may be electrically connected to the light emitting diodes, so as to drive the light emitting diodes to emit lights, but not limited thereto. The second functional layer FL2 is disposed on the second substrate SB2. Specifically, the second functional layer FL2 is disposed on a second surface SF2 (i.e., an inner surface) of the second substrate SB2. The second functional layer FL2 of the present embodiment may include color filters, a black matrix and/or a pixel defining layer, but not limited thereto. In some embodiments, when the electronic device 100 includes liquid crystal display (LCD), the second functional layer FL2 may further include a common electrode, but not limited thereto. It should be noted that although the first functional layer FL1 and the second functional layer FL2 in FIG. 1 are shown as a single layer respectively, the present disclosure is not limited thereto. In some embodiments, the first functional layer FL1 and the second functional layer FL2 may include multi-layer structure.

According to the present embodiment, as shown in FIG. 2, the electronic device 100 may for example be a border free device, that is, the electronic device 100 may not include the outer lead bonding region or the peripheral contact region of the electronic device 100 is located on the side-surface of the substrate (such as the first substrate SB1), but not limited thereto. As shown in FIG. 2, the electronic device 100 may include a plurality of pixel areas PA and a plurality of wires WR, wherein the pixel areas PA and the wires WR may for example be located on the first substrate SB1, but not limited thereto. In the present embodiment, the pixel areas PA may for example be the areas of the electronic device 100 for displaying images, for example, each of the pixel areas PA may be a pixel or a sub-pixel of the electronic device 100, but not limited thereto. The pixel areas PA may for example include the light emitting elements, the driving elements and/or the driving circuits mentioned above, but not limited thereto. The light emitting elements may be included in different pixel areas PA to emit lights of the same color or different colors (such as red light, green light and blue light, but not limited thereto). The light emitting elements for example may include light emitting diode (LED), organic light emitting diodes (OLED), mini light emitting diodes (mini LED), micro light emitting diodes (micro LED), other types of light emitting diodes or the combinations of the above-mentioned light emitting diodes, but not limited thereto. The driving elements and/or the driving circuits may include thin film transistor elements such as top gate thin film transistor, bottom gate thin film transistor, multi-gate thin film transistor or the combinations of the above-mentioned thin film transistors, but not limited thereto. In some embodiments, because the electronic device 100 may be a border free device, one or more the pixel areas PA may further include gate driver circuits (including shift registers and/or buffer), electrostatic discharge (ESD) protection elements (such as ESD diodes), inspection circuits, signal monitor lines and/or other suitable elements, but not limited thereto. The wires WR of the present embodiment may include any suitable signal line of the electronic device 100. For example, the wires WR may include power lines of the light emitting elements, gate driver circuits, electrostatic discharge elements, data lines, scan lines, driver control signals, inspection lines and/or other suitable signal lines, but not limited thereto. The material of the wires WR may for example include copper, silver, gold, aluminum, other suitable conductive materials or the combinations of the above-mentioned materials, but not limited thereto. In some embodiments, the signal lines in the wires WR may be electrically connected to the elements in the pixel areas PA for signal transmission. For example, although the connection is not illustrated in FIG. 2, the data lines or scan lines in the wires WR may be electrically connected to the driving elements in the pixel areas PA to transmit driving signals, but not limited thereto. It should be noted that although FIG. 2 only shows the wires WR extending along the direction X, the present disclosure is not limited thereto. The electronic device 100 may also include the wires WR extending along the direction Y, such as the scan lines, and the pixel areas PA may be defined as the regions formed by crossing of the data lines and the scan lines, but not limited thereto. The numbers, disposition positions and the shapes of each of the elements or the layers (such as the pixel areas PA and the wires WR) shown in FIG. 2 are only for illustration, which can be adjusted according to the demands of the design.

As mentioned above, the electronic device 100 of the present disclosure may be a border free device. Therefore, a side printing process is needed to form the contacts between the wires WR and the peripheral circuits or connection pads (not shown), but not limited thereto. In the present embodiment, the peripheral circuits and/or connection pads may be disposed on the outer surface RS of the first substrate SB1, but not limited thereto. Therefore, as shown in FIG. 1 and FIG. 2, the electronic device 100 of the present disclosure may include a plurality of first conductive wires CW1 disposed on the first surface SF1 and a plurality of dam walls DW disposed at the side of the electronic device 100, and the side printing process may be performed on the electronic device 100 to form the contacts between the first conductive wires CW1 and the peripheral circuits or connection pads (such as the process unit, but not limited thereto), such that the first conductive wires CW1 may be electrically connected to the peripheral circuits or connection pads at the outer surface RS of the first substrate SB1. In some embodiments, as shown in FIG. 1, the dam walls DW may be disposed between the first functional layer FL1 and the second functional layer FL2. The side printing process may be for example performed by using the metal paste to draw wirings on the side-surface of the substrate, wherein the metal paste may include any suitable metal material such as tin, silver(Ag), copper(Cu), gold(Au), palladium(Pb), platinum(Pt), etc., but not limited thereto. The description about the side printing process may be applied to each of the embodiments of the present disclosure, and will not be redundantly described in the following. In addition, it should be noted that although the first conductive wires CW1 and the dam walls DW shown in FIG. 2 are disposed at the lower side of the electronic device 100, the present disclosure is not limited thereto. In some embodiments, the first conductive wires CW1 and the dam walls DW may be disposed at one or more than one side of the electronic device 100.

According to the present embodiment, the electronic device 100 includes a plurality of first conductive wires CW1 and a plurality of dam walls DW disposed at the side of the electronic device 100, but not limited thereto. In detail, as shown in FIG. 1 and FIG. 2, the first conductive wires CW1 and the dam walls DW are disposed on the first surface SF1 of the first substrate SB1, but not limited thereto. The first side-surface SSF1 and the second side-surface SSF2 may be aligned to each other in the direction Z. In some embodiments, the functional layer (such as the first functional layer FL1) may be disposed between the first conductive wires CW1 and the first substrate SB1 and/or the dam walls DW and the first substrate SB1, but not limited thereto. According to the present embodiment, as shown in FIG. 1, the dam walls DW may be located between any adjacent two of the first conductive wires CW1 respectively, that is, the first conductive wires CW1 and the dam walls DW are alternately disposed on the first surface SF1, such that the dam walls DW may separate any two adjacent first conductive wires CW1, but not limited thereto. For example, a first conductive wire CW1-1 is disposed between a dam wall DW-1 and a dam wall DW-2, and a first conductive wire CW1-2 is disposed between the dam wall DW-2 and a dam wall DW-3. In some embodiments, as shown in FIG. 2, the dam walls DW extend along the direction X, and the outer side-surface DWS of the dam walls DW may be substantially aligned with the first side-surface SSF1. The material of the first conductive wires CW1 may refer to the material of the wires WR, and will not be redundantly described. Each of the dam walls DW of the present embodiment may include any suitable insulating materials, for example, the dam walls DW may include a pixel defining layer (PDL), color filter resin, silicone resin, epoxy resin, acrylic resin, other suitable insulating materials or the combinations of the above-mentioned materials, but not limited thereto. So that, the electronic device 100 may include the dam walls DW located between any adjacent two of the first conductive wires CW1, and the short of the first conductive wires CW1 due to the abnormal conditions of the side printing process may be reduced, thereby improving the quality of the electronic device 100. According to the present embodiment, the dam walls DW may be formed on the first surface SF1 by photolithography, inkjet printing, screen printing, dispenser drawing or other suitable methods, but not limited thereto.

The details of the side printing process will be described in the following. In addition, according to the present embodiment, the thickness of the dam walls DW may be greater than the thickness of the first conductive wires CW1, but not limited thereto. In detail, as shown in FIG. 1, the first conductive wires CW1 may have a thickness H1 in the direction Z, the dam walls DW may have a thickness H2 in the direction Z, and the thickness H2 may be greater than the thickness H1, but not limited thereto. In some embodiments, as shown in FIG. 1, the thickness H2 of the dam walls may for example be equal to the distance between the first functional layer FL1 disposed on the first substrate SB1 and the second functional layer FL2 disposed on the second substrate SB2, that is, the dam walls DW may separate the first substrate SB1 and the second substrate SB2, and the thickness H1 of the first conductive wires CW1 may be less than the thickness H2, but not limited thereto. It should be noted that the first functional layer FL1 and the second functional layer FL2 shown in FIG. 1 are not limited to a single layer structure. For example, in some embodiments, the first functional layer FL1 and the second functional layer FL2 may include multi-layer structure respectively, and the distance between the first functional layer FL1 and the second functional layer FL2 may be defined as the distance between a surface of the first functional layer FL1 and a surface of the second functional layer FL2 which are the closest to each other, such as the distance between the surface FL1-1 and the surface FL2-1, but not limited thereto. According to the present embodiment, the thickness H2 of the dam walls DW greater than the thickness H1 of the first conductive wires CW1 may decrease the short situation of the first conductive wires CW1 or decrease other unnecessary hurt to the first conductive wires CW1 or the electronic device 100, but not limited thereto. The relationship of the thicknesses of the first conductive wires CW1 and the dam walls DW may be applied to each of the embodiments of the present disclosure, and will not be redundantly described in the following.

Referring to FIG. 3A and FIG. 3B, FIG. 3A schematically illustrates a partial top view of the first substrate of the electronic device in a side printing process according to the first embodiment of the present disclosure, and FIG. 3B schematically illustrates a partial side view of the electronic device in a side printing process according to the first embodiment of the present disclosure. In order to simplify the figure, FIG. 3A only shows a portion of the first substrate SB1 of the electronic device 100, and other elements of the electronic device 100 may refer to the above-mentioned contents, but not limited thereto. The structure shown in FIG. 3A may be the structure in the region RO shown in FIG. 2, but not limited thereto. As shown in FIG. 3A and FIG. 3B, when the side printing process is performed on the electronic device 100, according to some embodiments, the electronic device 100 may further include a plurality of second conductive wires CW2 may be disposed corresponding to the first conductive wires CW1 respectively, but not limited thereto. In detail, as shown in FIG. 3B, during the side printing process, the second conductive wires CW2 may be disposed on the first side-surface SSF1 of the first substrate SB1 and the second side-surface SSF2 of the second substrate SB2, and the second conductive wires CW2 may be electrically connected to the corresponding first conductive wires CW1 respectively, for example, the first conductive wires CW1 can be electrically connected to the peripheral circuits (such as the process unit) and/or connection pads through the second conductive wires CW2, but not limited thereto. In the present embodiment, the peripheral circuits and/or connection pads may for example be disposed on the outer surface RS of the first substrate SB1, but not limited thereto. In some embodiments, as shown in FIG. 3A, the second conductive wires CW2 may extend on the first surface SF1 of the first substrate SB1 and cover a portion of the first conductive wires CW1, thereby improving the electrical connection between the first conductive wires CW1 and the second conductive wires CW2. That is, the portions of the second conductive wires CW2 extending on the first surface SF1 are disposed on the portions of the first conductive wires CW1. The material of the second conductive wires CW2 may refer to the material of the first conductive wires CW1, and will not be redundantly described here.

As mentioned above, when the side printing process is performed on the electronic device 100, some abnormal conditions may occur, thereby causing a short of the first conductive wires CW1 in the conventional technique. In detail, as shown in FIG. 3A and FIG. 3B, the second conductive wires CW21 shown in FIG. 3A represent the ideal second conductive wires CW2 formed during the process without abnormal condition, wherein the second conductive wires CW21 may substantially be aligned with the corresponding first conductive wires CW1, and the width of the second conductive wires CW21 may be substantially the same as the width of the first conductive wires CW1, but not limited thereto. In some embodiments, the second conductive wire CW2 with a width slightly less than the width of the first conductive wires CW1 may also be the normal second conductive wire CW21, that is, a portion of the first conductive wire CW1 may be exposed by the second conductive wire CW21 in the side view shown in FIG. 3B, but not limited thereto. The width mentioned above may for example be defined as the length along the direction Y, but not limited thereto. The definition of the normal second conductive wires CW21 may be applied to each of the embodiments of the present disclosure, and will not be redundantly described in the following. Some abnormal conditions occurred in the side printing process are introduced in the following, but the present disclosure is not limited thereto.

In some embodiments, wider second conductive wires CW2 may be occurred during the side printing process, which is one of the abnormal conditions mentioned above. Therefore, when the required resolution of the electronic device 100 is increased, the short of the first conductive wires CW1 may be occurred due to the contact between adjacent two of the wider second conductive wires CW2 in the conventional technique. In detail, as shown in FIG. 3A and FIG. 3B, the wider second conductive wires CW22 may be occurred during the side printing process, wherein the width of the second conductive wires CW22 is excessively greater than the width of the first conductive wires CW1, such that the distance between the adjacent two second conductive wires CW22 may be reduced, and the possibility of a short of the first conductive wires CW1 may be increased. However, according to the present disclosure, because the electronic device 100 includes the dam walls DW disposed between any adjacent two of the first conductive wires CW1, the possibility of contact between the adjacent two second conducive wires CW22 may be reduced, thereby reducing the short of the first conductive wires CW1. For example, it can be seen from FIG. 3A that the adjacent two second conductive wires CW22 can be separated by the dam walls DW (such as the dam wall DW-4) in a top view of the electronic device 100 even though they have a greater width, such that the possibility of short of the conductive wires (including the first conductive wires CW1 and the second conductive wires CW2) may be reduced, but not limited thereto.

In some embodiments, the shift of the second conductive wires CW2 may be occurred during the side printing process, which is one of the abnormal conditions mentioned above. Therefore, the short of the first conductive wires CW1 or the second conductive wires CW2 may be occurred when the required resolution of the electronic device 100 is increased. In detail, as shown in FIG. 3A and FIG. 3B, when the shift of the second conductive wires CW2 is occurred, the second conductive wires CW2 formed by the side printing process may be presented as the second conductive wires CW23, wherein the second conductive wires CW23 are not aligned with the corresponding first conductive wires CW1 and are at the right (or the left side) of the center lines CTL of the corresponding first conductive wires CW1, but not limited thereto. In such conditions, the possibility that the second conductive wire CW23 is in contact with another first conductive wire CW1 adjacent to the corresponding first conductive wire CW1 of the second conductive wire CW23 or in contact with another second conductive wire CW2 adjacent to the second conductive wire CW23 may be increased, and the possibility of a short of the first conductive wires CW1 may be increased in a conventional display structure. However, according to the present disclosure, as shown in FIG. 3A and FIG. 3B, because the electronic device 100 includes the dam walls DW disposed between adjacent two of the first conductive wires CW1, the shifted second conductive wires CW23 would be blocked by the adjacent dam wall DW (such as the dam wall DW-5) in the top view of the electronic device 100, such that the contact between the second conductive wires CW23 and other first conductive wires CW1 or other second conductive wires CW2 may be reduced, and the short of the first conductive wires CW1 may thereby be reduced, but not limited thereto.

In some embodiments, when the side printing process is performed on the electronic device 100 with a small gap between the substrates (such as the first substrate SB1 and the second substrate SB2), a capillary phenomenon at the region between the first substrate SB1 and the second substrate SB2 may be occurred, which is one of the abnormal conditions mentioned above. Therefore, the short of the first conductive wires CW1 may be occurred when the required resolution of the electronic device 100 is increased. In detail, as shown in FIG. 3A and FIG. 3B, when the capillary phenomenon is occurred during the side printing process, the metal paste for forming the second conductive wires CW2 may be pulled into the electronic device 100, and the metal paste may fill the space between the first substrate SB1 and the second substrate SB2. Accordingly, the second conductive wires CW2 formed under this condition may represent as the second conductive wires CW24 shown in FIG. 3A and FIG. 3B, but not limited thereto. In such conditions, the distance between adjacent two of the second conductive wires CW24 may be reduced, such that the possibility of contact between the second conductive wires CW24 may be increased, and the possibility of short of the first conductive wires CW1 may thereby be increased. However, according to the present disclosure, as shown in FIG. 3A and FIG. 3B, because the electronic device 100 includes the dam walls DW disposed between any adjacent two of the first conductive wires CW1, the second conductive wires CW24 can be separated by the dam walls DW (such as the dam wall DW-6), such that the possibility of contact between the second conductive wires CW24 may be reduced, and the short of the first conductive wires CW1 may thereby be reduced, but not limited thereto.

Figure 5:
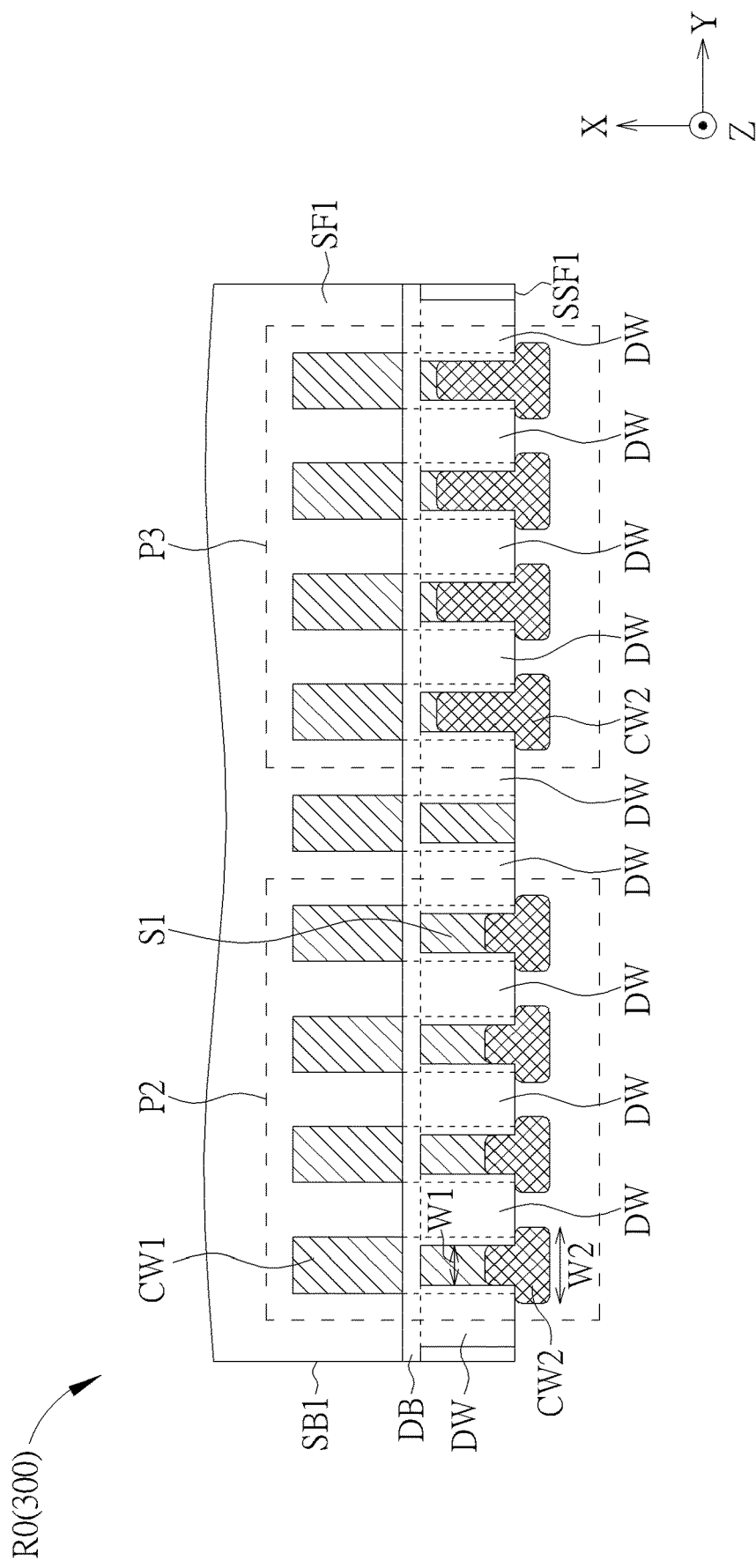
FIG. 5 schematically illustrates a partial top view of the first substrate of an electronic device in a side printing process according to a third embodiment of the present disclosure.

As mentioned above, in the conventional technique, some abnormal conditions may occur during the side printing process, such that the conductive wires formed by the side printing process may be in contact, and the quality of the electronic device may be reduced. However, because the electronic device 100 of the present disclosure includes the dam walls DW, the second conductive wires CW2 formed by the side printing process may be blocked by the dam walls DW even if the second conductive wires CW2 are formed under the abnormal conditions. Therefore, the possibility of the short of the first conductive wires CW1 may be reduced by the dam walls DW of the electronic device 100. It should be noted that the shape and width of the dam walls DW shown in FIG. 3A and FIG. 3B are only illustrative, and the present embodiment is not limited thereto. In some embodiments, the width of each of the dam walls DW may be various and not be limited to the width of the dam walls DW shown in FIG. 3A. For example, the width of each of the dam walls DW may be greater than a distance between two adjacent first conducive wires CW1, such that each of the dam walls DW may be partially overlapped with the corresponding first conductive wire CW1 in the top view (direction Z) of the electronic device 100 (as shown in FIG. 5). Therefore, the distance between two adjacent dam walls DW may be less than the width of the corresponding first conductive wire CW1 or the corresponding second conductive wire CW2, but not limited thereto.

More embodiments of the present disclosure will be described in the following. In order to simplify the description, the same layers or elements in the following embodiments would be labeled with the same symbol, and the features thereof will not be redundantly described. The differences between each of the embodiments will be described in detail in the following contents.

Referring to FIG. 4A and FIG. 4B, FIG. 4A schematically illustrates a partial top view of the first substrate of an electronic device according to a second embodiment of the present disclosure, and FIG. 4B schematically illustrates a partial top view of the first substrate of the electronic device in a side printing process according to the second embodiment of the present disclosure. In order to simplify the figure, FIG. 4A and FIG. 4B only show a portion of the first substrate SB1 of the electronic device 200, and other elements of the electronic device 200 may refer to the electronic device 100 of the first embodiment, but not limited thereto. In addition, the structure shown in FIG. 4A and FIG. 4B may refer to the region RO shown in FIG. 2, but not limited thereto. One of the main differences between the electronic device 200 shown in FIG. 4A and FIG. 4B and the electronic device 100 shown in FIG. 1 is the design of the dam walls DW. According to the present embodiment, the dam walls DW of the electronic device 200 may for example be patterned, and each of the patterned dam walls DW may be partially overlapped with the corresponding first conductive wire CW1 in a top view direction, parallel to the direction Z, of the electronic device 100, for example, each of the patterned dam wall DW may surround a portion of the corresponding first conductive wire CW1, but not limited thereto. In detail, as shown in FIG. 4A and FIG. 4B, the manufacturing method of the dam walls DW of the present embodiment may for example include providing a preliminary substrate PSB including the first substrate SB1 and a cutting portion CP, and a preliminary dam wall PDM may for example be formed on the preliminary substrate PSB by dispenser drawing, but not limited thereto. In some embodiments, the preliminary dam wall PDM may be formed by inkjet printing, screen printing, photolithography or other suitable methods. After the preliminary dam wall PDM is formed on the preliminary substrate PSB, a cutting process is performed to cut out the cutting portion CP of the preliminary substrate PSB, and the first substrate SB1 of the electronic device 200 is remained, but not limited thereto. Therefore, when the cutting portion CP of the preliminary substrate PSB is cut out, a portion (such as the portion P1) of the preliminary dam wall PDM may also be removed, and the dam walls DW of the present embodiment are thereby formed, but not limited thereto. According to the present embodiment, as shown in FIG. 4A and FIG. 4B, the dam walls DW may for example be upside down U-shaped, and each of the dam walls DW may surround a portion of the corresponding first conductive wire CW1 close to the first side-surface SSF1 and be partially overlapped with the corresponding first conductive wire CW1, such that the portions of any adjacent two of the first conductive wires CW1 near the first side-surface SSF1 are separated by the patterned dam walls DW, but not limited thereto. In some embodiments, the dam walls DW may include any suitable shape as long as they can separate the first conductive wires CW1, the present disclosure is not limited thereto. As mentioned above, because the dam walls DW of the present embodiment may separate any adjacent two of the first conductive wires CW1, the possibility of a short of the first conductive wires CW1 during the side printing process may be reduced even if some of the abnormal conditions are occurred in the side printing process. For example, as shown in FIG. 4B, the second conductive wires CW22 (wider conductive wires), the second conductive wires CW23 (shifted conductive wires) and the second conductive wires CW24 (affected by capillary phenomenon) are formed under different abnormal conditions of the side printing process mentioned above, while the second conductive wires CW21 are formed ideally. The details of different conditions of the side printing process are not redundantly described here. It can be seen from FIG. 4B that the dam walls DW of the present embodiment may separate the second conductive wires CW2 formed under different conditions of the side printing process, thereby preventing the second conductive wire CW2 from being in contact with another second conductive wire CW2. Therefore, the possibility of the short of the first conductive wires CW1 caused by the contact between the second conductive wires CW2 may be reduced due to the dam walls DW of the present embodiment, and the quality of the electronic device may thereby be improved. The design of the dam walls DW of the present embodiment may be applied to each of the embodiments of the present disclosure.

Referring to FIG. 5, FIG. 5 schematically illustrates a partial top view of the first substrate of an electronic device in a side printing process according to a third embodiment of the present disclosure. In order to simplify the figure, FIG. 5 only shows a portion of the first substrate SB1 of the electronic device 300, and other elements of the electronic device 300 may refer to the electronic device 100 of the first embodiment, but not limited thereto. In addition, the structure shown in FIG. 5 may be the structure corresponding to the region RO shown in FIG. 2, but not limited thereto. One of the main differences between the electronic device 300 shown in FIG. 5 and the electronic device 100 shown in FIG. 1 is the design of the dam walls DW. According to the present embodiment, the dam walls DW of the present embodiment may be designed to have a pattern making a distance between adjacent two of the dam walls DW be less than the width of the second conductive wires CW2, but not limited thereto. In detail, as shown in FIG. 5, the dam wall pattern shown in FIG. 5 may be formed of the dam walls DW and a dam bar DB extending along the direction Y and across the first conductive wires CW1, wherein the dam walls DW of the present embodiment may be for example connected through the dam bar DB, but not limited thereto. In addition, as shown in FIG. 5, each of the plurality of the dam walls DW is partially overlapped with the corresponding two of the plurality of first conductive wires CW1 in a top view direction (direction Z) of the electronic device 300 in the present embodiment, but not limited thereto. The direction Y mentioned above may be substantially parallel to the extending direction of scan lines (not shown) of the electronic device 300, but not limited to. In some embodiments, the dam bar DB may not be included in the electronic device 300, and the dam walls DW are separated from each other. The material of the dam bar DB may refer to the material of the dam walls DW, and will not be redundantly described here. The dam bar DB and the dam walls DW may be formed together. Accordingly, the dam walls DW of the present embodiment may be regarded as the protruding portions protruded from the dam bar DB respectively, or in other words, the dam walls DW of the present disclosure are separated, and the first conductive wires CW1 are included (or exposed) between any adjacent two of the dam walls DW; the dam bar DB of the present embodiment may be regarded as a continuous dam wall extending along the direction Y and across the first conductive wires CW1, and the first conductive wires CW1 are not exposed by the dam bar DB, but not limited thereto. In the present embodiment, as shown in FIG. 5, a distance W1 is included between any adjacent two of the dam walls DW, and the second conductive wires CW2 formed in the side printing process may include a width W2, wherein the distance W1 between adjacent two of the dam walls DW may be less than the width W2 of the second conductive wires CW2, but not limited thereto. The feature that the distance W1 between adjacent two of the dam walls DW is less than the width W2 of each of the second conductive wires CW2 may be applied to each of the embodiments of the present disclosure, and will not be redundantly described in the following.

According to the present embodiment, in order to improve the electrical connection between the first conductive wires CW1 and the second conductive wires CW2, the contact area between the first conductive wires CW1 and the second conductive wires CW2 may be increased, wherein the contact area between the first conductive wires CW1 and the second conductive wires CW2 may be increased by pulling up the metal paste for forming the second conductive wires CW2 during the manufacturing process of the electronic device 300, but not limited thereto. In addition, as mentioned above, each of the plurality of dam walls DW is partially overlapped with the corresponding one of the plurality of first conductive wires CW1 in a top view direction (direction Z) of the electronic device 300, which may bring the advantage that the possibility of contact between the second conductive wires CW2 and other adjacent first conductive wires CW1 in the side printing process may be reduced, thereby reducing the possibility of short of the first conductive wires CW1. In detail, as shown in FIG. 5, before the side printing process of the electronic device 300, a plate heating process may be performed to heat the plate (or the first substrate SB1, but not limited thereto). After that, the side printing process may be performed to dispose the metal paste on the side-surface (such as the first side-surface SSF1 and the second side-surface SSF2) in order to form the second conductive wires CW2 (as shown in the portion P2 of FIG. 5). Because the temperature of the first substrate SB1 is increased, the metal paste may expand, such as along the dam walls DW (for example, extend along the direction X) due to thermal expansion, thereby increasing the contact area between the first conductive wires CW1 and the metal paste (second conductive wires CW2). In addition, the manufacturing method of the second conductive wires CW2 of the present disclosure may further include a cooling process after the plate heating process and the side printing process. In detail, it can be seen from FIG. 5 that when the side printing process is performed to dispose the metal paste, a space (such as the space Si shown in the portion P2) enclosed by the metal paste, the dam walls DW and the dam bar DB may be formed, and when the temperature of the electronic device 300 is reduced due to the cooling process, the pressure of the space Si enclosed by the metal paste, the dam walls DW and the dam bar DB may be reduced, such that the metal paste may be pulled into the electronic device 300 due to the pressure difference, and the contact area between the first conductive wires CW1 and the metal paste may be increased. Moreover, as mentioned above, because the distance W1 between adjacent two of the dam walls DW is less than the width W2 of the second conductive wires CW2 in the present embodiment, the metal paste for forming the second conductive wires CW2 may extend into the electronic device 300 farther, such that the electrical connection between the first conductive wires CW1 and the second conductive wires CW2 may be improved, but not limited thereto. In another aspect, if the width W2 of the second conductive wires CW2 is less than the distance W1 between the dam walls DW, the gas in the space Si may leak out, and the pulling effect caused by the gas may be reduced. Therefore, the design that the distance W1 is less than the width W2 may improve the pulling effect, but not limited thereto. The structure in which the metal paste is pulled may refer to the portion P3 shown in FIG. 5. Accordingly, the portion P3 shows the more likely structure of the electron device 300 of this embodiment. According to the present embodiment, because the first conductive wires CW1 and/or the second conductive wires CW2 are separated by the dam walls DW of the present embodiment, the short of the first conductive wires CW1 caused by the contact between the second conductive wires CW2 may be reduced even if the second conductive wires CW2 are formed under the abnormal conditions of the side printing process mentioned above. The design of the dam walls DW of the present embodiment may be applied to each of the embodiments of the present disclosure, and will not be redundantly described in the following.

Figure 6:
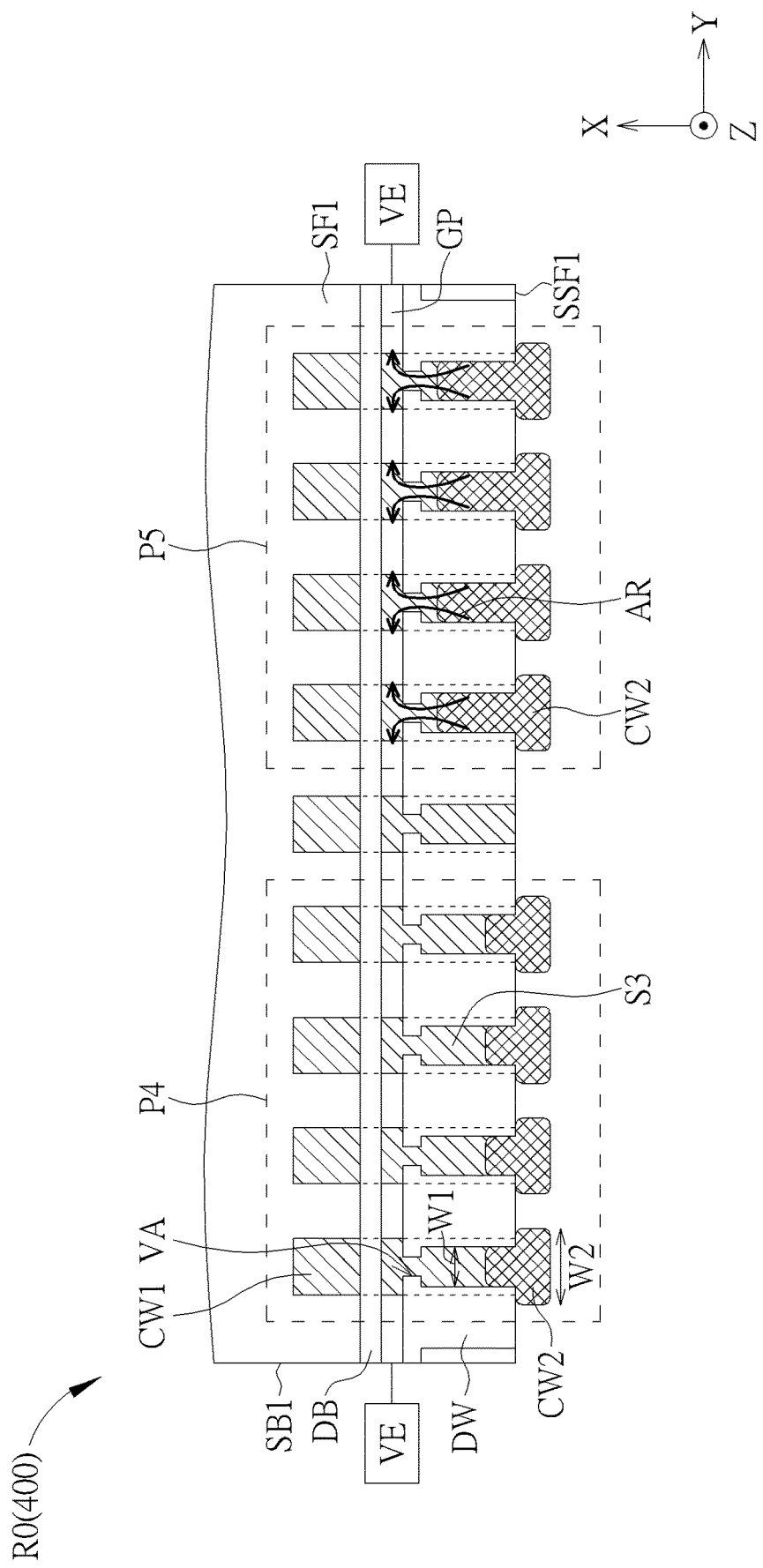
FIG. 6 schematically illustrates a partial top view of the first substrate of an electronic device in a side printing process according to a fourth embodiment of the present disclosure.

Referring to FIG. 6, FIG. 6 schematically illustrates a partial top view of the first substrate of an electronic device in a side printing process according to a fourth embodiment of the present disclosure. In order to simplify the figure, FIG. 6 only shows a portion of the first substrate SB1 of the electronic device 400, and other elements of the electronic device 400 may refer to the electronic device 100 of the first embodiment, but not limited thereto. In addition, the structure shown in FIG. 6 may be the structure corresponding to the region RO shown in FIG. 2, but not limited thereto. One of the main differences between the electronic device shown in FIG. 6 and the electronic device shown in FIG. 5 is the design of the dam walls DW. According to the present embodiment, as shown in FIG. 6, the dam bar DB and the dam walls DW of the electronic device 400 may be separated in the present embodiment, but not limited thereto. In addition, a gap GP may be formed between the dam bar DB and the dam walls DW, and two adjacent dam walls DW may be separate from each other to form a via VA in the present embodiment, but not limited thereto. The material of the dam bar DB may refer to the material of the dam walls DW, and will not be redundantly described here. As mentioned above, the electrical connection between the first conductive wires CW1 and the second conductive wires CW2 may be improved by increasing the contact area between the first conductive wires CW1 and the second conductive wires CW2, and according to the present embodiment, because the gap GP is formed between the dam bar DB and the dam walls DW, the pulling of the metal paste for forming the second conductive wires CW2 may for example be performed through the gap GP, but not limited thereto. In detail, as shown in FIG. 6, the vacuum equipment VE may for example be connected to two ends of the gap GP, and the side printing process is performed to dispose the metal paste on the side-surface (the first side-surface SSF1 and the second side-surface SSF2) of the electronic device 400, as shown in the portion P4 of FIG. 6. It should be noted that the side printing process and the connection between the vacuum equipment VE and the electronic device 400 may be performed in any suitable order, and the present disclosure is not limited thereto. After that, the vacuum equipment VE may be turned on, such that the gas in the space (such as the space S3) formed by the dam walls DW and the metal paste may be removed by the vacuum equipment VE through the gap GP and the vias VA, but not limited thereto. The gas flow may for example be shown as the arrows AR of FIG. 6. Therefore, the metal paste disposed in the side printing process may be pulled into the electronic device 400 due to the pressure difference, and the contact area between the first conductive wires CW1 and the metal paste (the second conductive wires CW2) may be increased (as shown in the portion P5 of FIG. 6), thereby improving the electrical connection between the first conductive wires CW1 and the second conductive wires CW2. The portion P5 in FIG. 6 may be considered as the structure of the electronic device 400 after the side printing process according to this embodiment. It should be noted that because the pulling process of the metal paste may be performed through the gap GP and the vacuum equipment VE in the present embodiment, the plate heating process may not be needed, and the manufacturing process may thereby be simplified, but not limited thereto. Similarly, because the distance W1 between adjacent two of the dam walls DW is less than the width W2 of the second conductive wires CW2 in the present embodiment, the metal paste for forming the second conductive wires CW2 may be pulled into the electronic device 400 farther, such that the electrical connection between the first conductive wires CW1 and the second conductive wires CW2 may further be improved, but not limited thereto. In addition, the design that the distance W1 is less than the width W2 may prevent the gas from leaking, thereby improving the pulling of the metal paste, but not limited thereto. In the present embodiment, as shown in FIG. 6, because the dam walls DW of the present embodiment may separate the first conductive wires CW1 and/or the second conductive wires CW2, the short of the first conductive wires CW1 caused by the contact between the second conductive wires CW2 may be reduced even if the second conductive wires CW2 are formed under the abnormal conditions of the side printing process mentioned above. The design of the dam walls DW of the present embodiment may be applied to each of the embodiments of the present disclosure, and will not be redundantly described in the following.

Figure 7A:
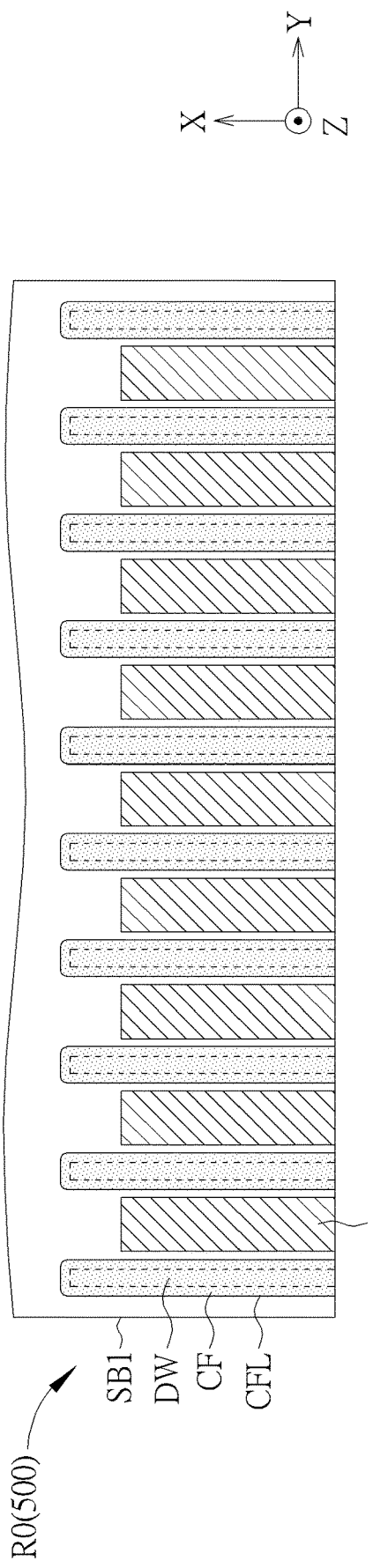
FIG. 7A schematically illustrates a partial top view of the first substrate of an electronic device according to a fifth embodiment of the present disclosure.
Figure 7B:
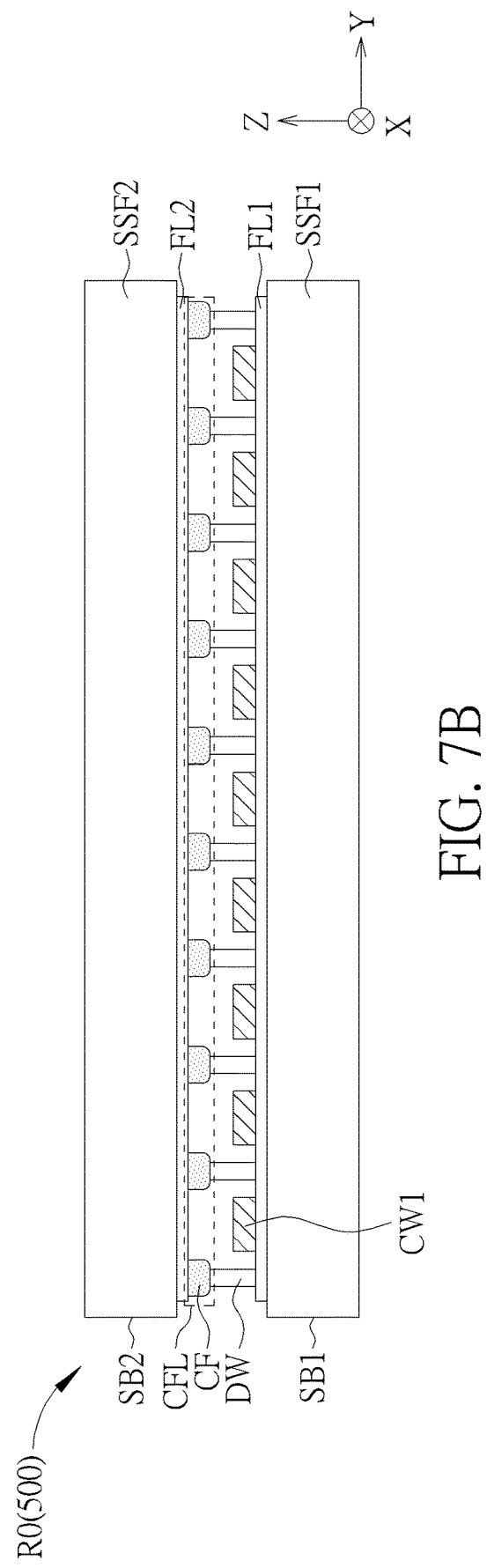
FIG. 7B schematically illustrates a partial side view of the electronic device according to the fifth embodiment of the present disclosure.

Referring to FIG. 7A and FIG. 7B, FIG. 7A schematically illustrates a partial top view of the first substrate of an electronic device according to a fifth embodiment of the present disclosure, and FIG. 7B schematically illustrates a partial side view of the electronic device according to the fifth embodiment of the present disclosure. In order to simplify the figure, FIG. 7A only shows a portion of the first substrate SB1 and the color filters CF of the electronic device 500, and other elements of the electronic device 500 may refer to the electronic device 100 of the first embodiment, but not limited thereto. In addition, the structure shown in FIG. 7A may be the structure corresponding to the region RO shown in FIG. 2, but not limited thereto. According to the present embodiment, as shown in FIG. 7A and FIG. 7B, the electronic device 500 may include a color filter layer CFL disposed on the second substrate SB2. The color filter layer CFL may include a plurality of color filters CF, wherein the dam walls DW of the present embodiment may be disposed corresponding to the color filters CF respectively, but not limited thereto. In addition, the color filters CF of the present embodiment may not be overlapped with the first conductive wires CW1 in the top view direction (such as the direction Z) of the electronic device 500, but not limited thereto. It should be noted that although the electronic device 100 shown in FIG. 1 does not show the color filters, the color filters thereof may be included in the second functional layer FL2, which is mentioned above. The color filters CF shown in FIG. 7A and FIG. 7B may for example be the color filters of the same color or different colors, and the present disclosure is not limited thereto. For example, the color filters CF shown in FIG. 7A and FIG. 7B may include the color filters of red, green and blue arranged alternately, but not limited thereto. According to the present embodiment, as mentioned above, because the material of the dam walls DW may include color filter resin, and the dam walls DW are disposed corresponding to the color filters CF, the dam walls DW and the color filters CF may for example be formed in the same step of the manufacturing process of the electronic device 500, thereby simplify the process, but not limited thereto. In some embodiments, the dam walls DW of the present embodiment may include other suitable materials in addition to color filter resin. The design that the dam walls DW are disposed corresponding to the color filters CF can be applied to each of the embodiments of the present disclosure, and will not be redundantly described in the following. According to the present disclosure, a side printing process can be performed to form the second conductive wires (not shown, which can be referred to FIG. 3A, FIG. 3B and FIG. 4B) on the first side-surface SSF1 of the first substrate SB1 and the second side-surface SSF2 of the second substrate SB2. Each second conductive wire will connect to the corresponding first conductive wire CW1 and may fill into the space between the corresponding two adjacent dam walls DW to cover a portion of the corresponding first conductive wire CW1, which will not be detailed repeatedly, as well as the sixth embodiment shown in FIG. 8A and FIG. 8B. It should be noted that "the second conductive wire may fill into the space between two adjacent dam walls DW" mentioned above may represent that the second conductive wire is filled into the space, or, the second conductive wire is at least partially filled into the space, the present disclosure is not limited thereto.

Referring to FIG. 8A and FIG. 8B, FIG. 8A schematically illustrates a partial top view of the first substrate of an electronic device according to a sixth embodiment of the present disclosure, and FIG. 8B schematically illustrates a partial side view of the electronic device according to the sixth embodiment of the present disclosure. In order to simplify the figure, FIG. 8A only shows a portion of the first substrate SB1 and the color filters CF of the electronic device 600, and other elements of the electronic device 600 may refer to the electronic device 100 of the first embodiment, but not limited thereto. In addition, the structure shown in FIG. 8A may be the structure corresponding to the region RO shown in FIG. 2, but not limited thereto. One of the main differences between the electronic device shown in FIG. 8A and FIG. 8B and the electronic device shown in FIG. 7A and FIG. 7B is the design of the color filters CF. According to the present embodiment, as shown in FIG. 8A and FIG. 8B, the electronic device 600 may include a color filter layer including a plurality of color filters CF, wherein the dam walls DW of the present embodiment may be disposed corresponding to the color filters CF respectively. In addition, the color filters CF of the present embodiment may for example be connected to each other, that is, the color filters CF may at least be partially overlapped with the first conductive wires CW1 in the top view direction (direction Z) of the electronic device 600, and there is no gap between any adjacent two of the color filters CF, but not limited thereto. Therefore, the first conductive wires CW1 of the present embodiment may for example be covered by the color filters CF, but not limited thereto. It should be noted that in the present disclosure, the term "a layer covers another layer" may be applicable to the condition that there is no other layer disposed between the layer and the another layer and to the condition that other layers may be disposed between the layer and the another layer. Therefore, "the first conductive wires CW1 are covered by the color filters CF" mentioned above may include the conditions that there is no layer disposed between the first conductive wires CW1 and the color filters CF, or other layers may be disposed between the first conductive wires CW1 and the color filters CF, but not limited thereto. The types or colors of the color filters CF may be referred to in the above-mentioned contents, and will not be redundantly described here. According to the present embodiment, because there is no gap between the color filters CF of the electronic device 600, some peripheral elements such as the bonding pad or conductive wires (for example, the first conductive wires CW1, but not limited thereto) may be shielded by the color filters CF, such that the peripheral elements may not be easily perceived by the users, thereby improving the performance of the electronic device 600 or the border free electronic device may be generated. The design of the color filters CF of the present embodiment may be applied to each of the embodiments of the present disclosure, and will not be redundantly described in the following.

Figure 9A:
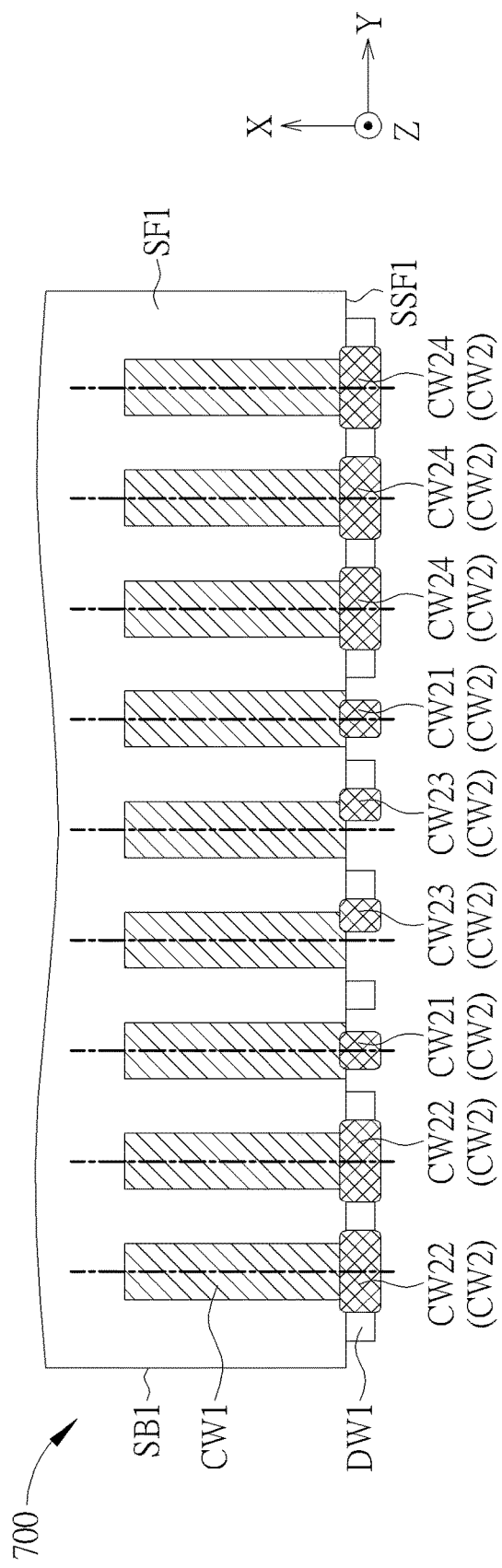
FIG. 9A schematically illustrates a partial top view of the first substrate of an electronic device in a side printing process according to a seventh embodiment of the present disclosure.
Figure 9B:
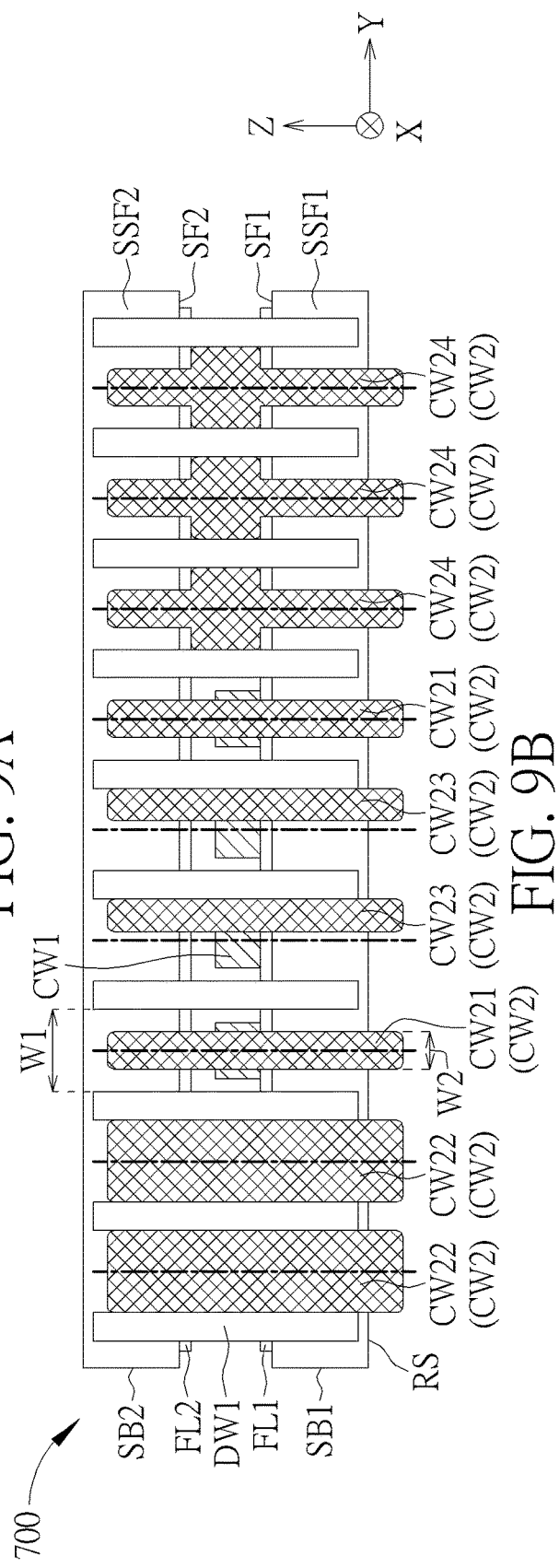
FIG. 9B schematically illustrates a partial side view of the electronic device in a side printing process according to the seventh embodiment of the present disclosure.

Referring to FIG. 9A and FIG. 9B, FIG. 9A schematically illustrates a partial top view of the first substrate of an electronic device in a side printing process according to a seventh embodiment of the present disclosure, and FIG. 9B schematically illustrates a partial side view of the electronic device in a side printing process according to the seventh embodiment of the present disclosure. In order to simplify the figure, FIG. 9A only shows a portion of the first substrate SB1 of the electronic device 700, and other elements of the electronic device 700 may refer to the electronic device 100 of the first embodiment, but not limited thereto. In addition, the portion of the first substrate SB1 shown in FIG. 9A may be the portion of the first substrate SB1 corresponding to the region RO shown in FIG. 2, but not limited thereto. According to the present embodiment, as shown in FIG. 9A and FIG. 9B, the electronic device 700 may include a first substrate SB1, a second substrate SB2, a plurality of first conductive wires CW1 disposed on the first substrate and a plurality of first dam walls DW1 disposed on the first substrate SB1 and the second substrate SB2, but not limited thereto. In detail, as shown in FIG. 9A and FIG. 9B, the first substrate SB1 may include a first surface SF1 and a first side-surface SSF1 adjacent to the first surface, the second substrate SB2 includes a second surface SF2 and a second side-surface SSF2 adjacent to the second surface SF2, the first conductive wires CW1 are disposed on the first surface SF1 of the first substrate SB1, and the first dam walls DW1 are disposed on the first side-surface SSF1 of the first substrate SB1 and the second side-surface SSF2 of the second substrate SB2, wherein the first dam walls DW1 may be located between any adjacent two of the second conductive wires CW2 respectively in the top view shown in FIG. 9A, but not limited thereto. According to some embodiments, the first dam walls DW1 may be located between any adjacent two of the first conductive wires CW1 respectively in the top view shown in FIG. 9A, but not limited thereto. The material of the first dam walls DW1 may refer to the material of the dam walls mentioned in the embodiments above, but not limited thereto. The first dam walls DW1 of the present embodiment may for example be disposed on the first side-surface SSF1 and the second side-surface SSF2 through inkjet printing, screen printing or dispenser drawing, but not limited thereto. In addition, as shown in FIG. 9B, the electronic device 700 of the present embodiment may include a first functional layer FL1 disposed on the first surface SF1 and a second functional layer FL2 disposed on the second surface SF2, but not limited thereto. The first substrate SB1, the second substrate SB2, the first conductive wires CW1, the first functional layer FL1 and the second functional layer FL2 of the present embodiment may refer to the above-mentioned embodiments, and will not be redundantly described here. According to the present embodiment, because the electronic device 700 includes the first dam walls DW1 disposed on the first side-surface SSF1 and the second side-surface SSF2, the conductive wires formed during the side printing process may be separated by the first dam walls DW1, that is, the contact between the conductive wires may be reduced by the first dam walls DW1, such that the short of the first conductive wires CW1 may be reduced. In detail, as shown in FIG. 9A and FIG. 9B, in the side printing process, a plurality of second conductive wires CW2 may be disposed on the first side-surface SSF1 of the first substrate SB1 and the second side-surface SSF2 of the second substrate SB2 to be electrically connected to the corresponding first conductive wires CW1 respectively, such that the first conductive wires CW1 may be electrically connected to the peripheral circuits (such as the process unit) through the second conductive wires CW2 after the second conductive wires CW2 are electrically connected to the peripheral circuits, but not limited thereto. In the present embodiment, the peripheral circuits may for example be disposed on the outer surface RS of the first substrate SB1, but not limited thereto. As mentioned above, some abnormal conditions may be occurred during the side printing process, such that the possibility of contact between adjacent two of the second conductive wires CW2 may be increased. For example, as shown in FIG. 9B, the conductive wires formed under abnormal conditions such as the wider second conductive wires CW22, the shifted second conductive wires CW23 and the second conductive wires CW24 affected by capillary phenomenon may increase the possibility of short of the first conductive wires CW1. The details are mentioned above, and will not be redundantly described here. However, as shown in FIG. 9B, because the first dam walls DW1 of the present embodiment may block the second conducive wires CW2 even if the second conductive wires CW2 are formed under abnormal conditions, the possibility of contact between the second conductive wires CW2 may be reduced, thereby reducing the short of the first conductive wires CW1, but not limited thereto. In addition, because the second conductive wires CW2 may be blocked by the first dam walls DW1, as shown in FIG. 9B, in the direction Y, the distance W1 between adjacent two of the first dam walls DW1 may be greater than the width W2 of one of the second conductive wires CW2. The design of the first dam walls DW1 of the present embodiment may be applied to each of the embodiments of the present disclosure, and will not be redundantly described in the following.

Figure 10A:
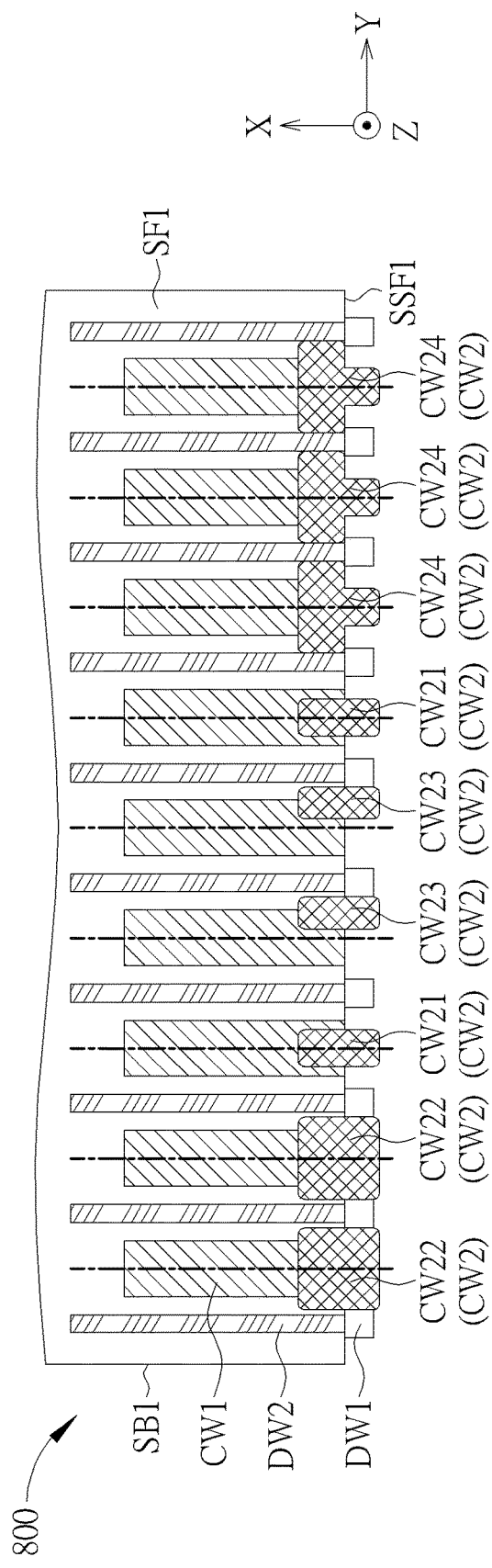
FIG. 10A schematically illustrates a partial top view of an electronic device in a side printing process according to an eighth embodiment of the present disclosure.
Figure 10B:
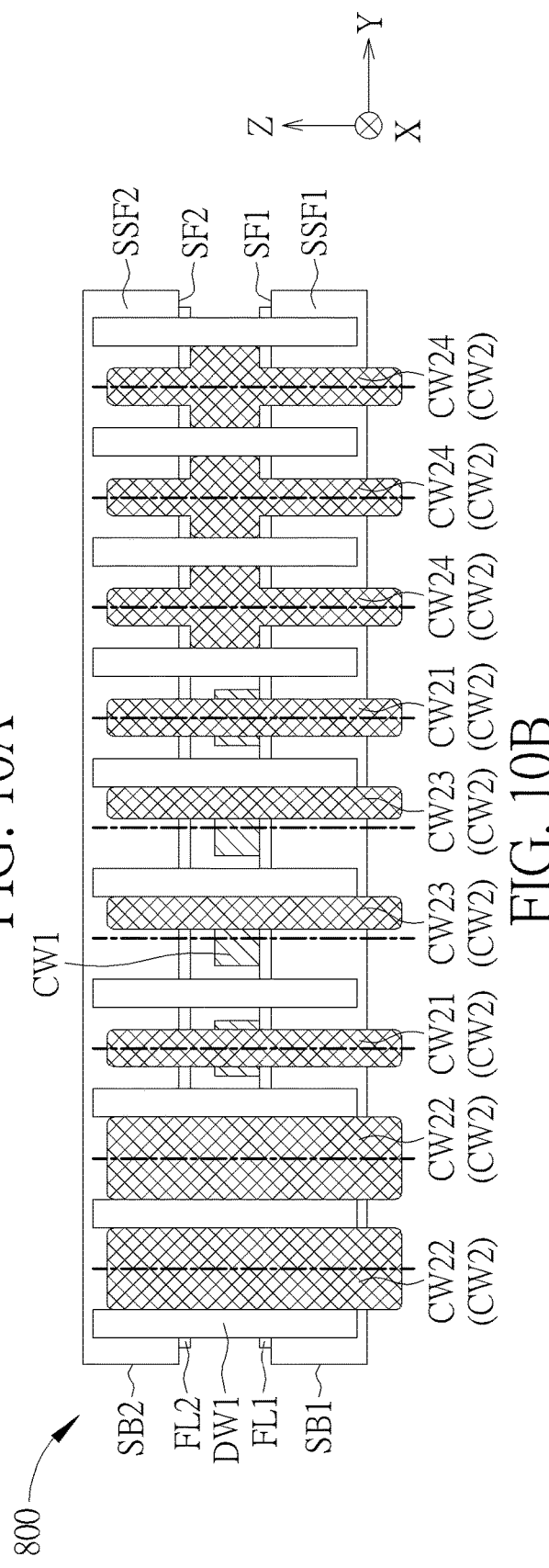
FIG. 10B schematically illustrates a partial side view of the electronic device in a side printing process according to the eighth embodiment of the present disclosure.

Referring to FIG. 10A and FIG. 10B, FIG. 10A schematically illustrates a partial top view of an electronic device in a side printing process according to an eighth embodiment of the present disclosure, and FIG. 10B schematically illustrates a partial side view of the electronic device in a side printing process according to the eighth embodiment of the present disclosure. In order to simplify the figure, FIG. 10A only shows a portion of the first substrate SB1 of the electronic device 800, and other elements of the electronic device 800 may refer to the electronic device 100 of the first embodiment, but not limited thereto. In addition, the portion of the first substrate SB1 shown in FIG. 10A may be the portion of the first substrate SB1 corresponding to the region RO shown in FIG. 2, but not limited thereto. One of the main differences between the electronic device 800 shown in FIG. 10A and FIG. 10B and the electronic device shown in FIG. 9A and FIG. 9B is the design of the dam walls. According to the present embodiment, as shown in FIG. 10A, the electronic device 800 may further include a plurality of second dam walls DW2 disposed on the first surface SF1 of the first substrate SB1 in addition to the first dam walls DW1 mentioned above, but not limited thereto. That is, the electronic device 800 of the present embodiment may include the first dam walls DW1 disposed on the first side-surface SSF1 and the second side-surface SSF2 and the second dam walls DW2 disposed on the first surface SF1. The disposition and material of the first dam walls DW1 and the second dam walls DW2 of the present embodiment may refer to the dam walls DW of the embodiments mentioned above, and will not be redundantly described. In the present embodiment, as shown in FIG. 10A, the first dam walls DW1 and the second dam walls DW2 are disposed between any adjacent two of the first conductive wires CW1 in the top view of the electronic device 800, and each of the first dam walls DW1 may correspond to a corresponding second dam walls DW2 or may be in contact with a corresponding second dam walls DW2, but not limited thereto. The first dam walls DW1 and the second dam walls DW2 may include the same material or include different materials in the present embodiment. Similarly, as mentioned above, because the electronic device 800 of the present embodiment includes the first dam walls DW1 and the second dam walls DW2, the conductive wires (such as the second conductive wires CW2) formed in the side printing process may be separated by the first dam walls DW1 and the second dam walls DW2 even if the conductive wires are formed under abnormal conditions (for example, the wider second conductive wires CW22, the shifted second conductive wires CW23 and the second conductive wires CW24 affected by the capillary phenomenon), such that the short of the first conductive wires CW1 may be reduced, and the quality of the electronic device 800 may be improved. The design of the first dam walls DW1 and the second dam walls DW2 may be applied to each of the embodiments of the present disclosure.

Figure 11A:
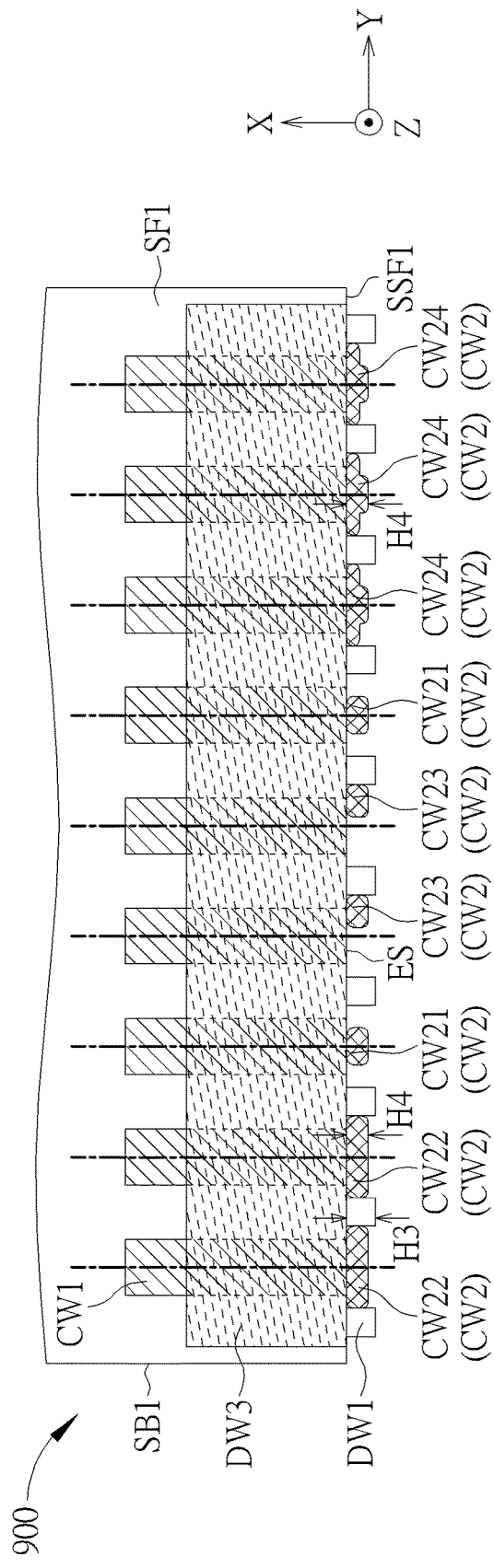
FIG. 11A schematically illustrates a partial top view of an electronic device in a side printing process according to a ninth embodiment of the present disclosure.
Figure 11B:
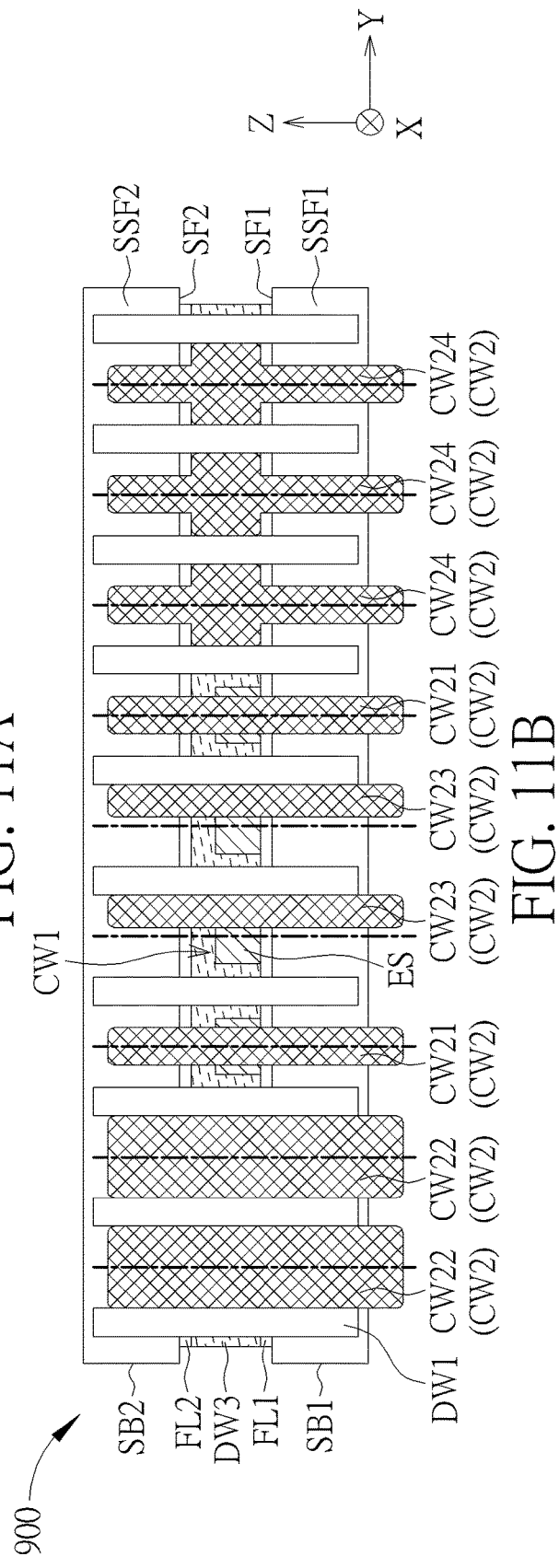
FIG. 11B schematically illustrates a partial side view of the electronic device in a side printing process according to the ninth embodiment of the present disclosure.

Referring to FIG. 11A and FIG. 11B, FIG. 11A schematically illustrates a partial top view of an electronic device in a side printing process according to a ninth embodiment of the present disclosure, and FIG. 11B schematically illustrates a partial side view of the electronic device in a side printing process according to the ninth embodiment of the present disclosure. In order to simplify the figure, FIG. 11A only shows a portion of the first substrate SB1 of the electronic device 900, and other elements of the electronic device 900 may refer to the electronic device 100 of the first embodiment, but not limited thereto. In addition, the portion of the first substrate SB1 shown in FIG. 11A may be the portion of the first substrate SB1 corresponding to the region RO shown in FIG. 2, but not limited thereto. One of the main differences between the electronic device 900 shown in FIG. 11A and FIG. 11B and the electronic device shown in FIG. 9A and FIG. 9B is the design of the dam walls.

According to the present embodiment, as shown in FIG. 11A and FIG. 11B, the electronic device 900 may further include a third dam wall DW3 disposed on the first surface SF1 of the first substrate SB1, wherein the third dam wall DW3 may for example be filled between the first substrate SB1 and the second substrate SB2, and the third dam wall DW3 may cover at least a portion of the first conductive wires CW1 close to the second conductive wires CW2, but not limited thereto. In detail, as shown in FIG. 11A and FIG. 11B, the third dam wall DW3 of the present embodiment may for example be a continuous layer covering the portion of the first conductive wires CW1 close to the second conductive wires CW2, and the surfaces (such as the surface ES of the first conductive wire CW1) of the first conductive wires CW1 may be exposed by the third dam wall DW3, but not limited thereto. According to the present embodiment, the third dam wall DW3 may be disposed between the first functional layer FL1 and the second functional layer FL2. In the present embodiment, the material of the third dam wall DW3 may be referred to in the material of the dam walls mentioned above, and will not be redundantly described here. The third dam wall DW3 and the first dam walls DW1 may include the same material or include different materials, the present disclosure is not limited thereto. According to the present embodiment, as mentioned above, because the electronic device 900 includes the first dam walls DW1 and the third dam wall DW3, the conductive wires (such as the second conductive wires CW2) formed in the side printing process may be separated by the first dam walls DW1 and the third dam wall DW3 even if the conductive wires are formed under abnormal conditions (for example, the wider second conductive wires CW22, the shifted second conductive wires CW23 and the second conductive wires CW24 affected by the capillary phenomenon shown in FIG. 11B), such that the short of the first conductive wires CW1 may be reduced, and the quality of the electronic device 900 may be improved. It should be noted that in the side printing process of the present embodiment, the second conductive wires CW2 may for example be in contact with the first conductive wires CW1 through the surfaces (such as the surface ES shown in FIG. 11A and FIG. 11B) of the first conductive wires CW1 exposed by the second dam wall DW2, but not limited thereto. In addition, as shown in FIG. 11A and FIG. 11B, because the third dam wall DW3 of the present embodiment is filled between the first substrate SB1 and the second substrate SB2, such that moisture or oxygen may be blocked by the third dam wall DW3, the electronic elements disposed in the electronic device 900 may be protected by the third dam wall DW3, but not limited thereto. It should be noted that although the third dam wall DW3 is filled into the first substrate SB1 and the second substrate SB2 and connects the first substrate SB1 and the second substrate SB2, the present embodiment is not limited thereto. In some embodiments, the third dam wall DW3 may be disposed on the first substrate SB1 and covers the first conductive wires CW1 without being in contact with the second substrate SB2, but not limited thereto. The design of the first dam wall DW1 and the third dam wall DW3 may be applied to each of the embodiments of the present disclosure.

In the present embodiment, the thickness of the first dam walls DW1 may be greater than the thickness of the second conductive wires CW2, but not limited thereto. In detail, as shown in FIG. 11A and FIG. 11B, the first dam walls DW1 may have a thickness H3, and the second conductive wires CW2 may have a thickness H4, wherein the thickness H3 is greater than the thickness H4. It should be noted that the thickness of the second conductive wires CW2 may be defined by using any one of the second conductive wires CW2, and the thickness H4 shown in FIG. 11A is only an example. In addition, when the second conductive wires CW2 includes irregular shape (such as the second conductive wires CW24 shown in FIG. 11A, but not limited thereto), the thickness of the second conductive wire may for example be the maximum thickness of the second conductive wire CW2 in the direction Z (i.e. in a top view direction), but not limited thereto. According to the present disclosure, the electronic devices may be mass produced, wherein the metal paste for forming the second conductive wires of an electronic device and the metal paste for forming the second conductive wires of another electronic device adjacent to the electronic device may be in contact with each other, thereby reducing the yield. However, according to the present embodiment, because the thickness H3 of the first dam wall DW1 is greater than the thickness H4 of the second conductive wires CW2, the possibility of contact between the second conductive wires CW2 in different electronic devices may be reduced, thereby improving the yield. The design mentioned above may be applied to each of the embodiments of the present disclosure.

In summary, an electronic device is provided by the present disclosure, wherein the electronic device includes the dam walls disposed between any adjacent two of the conductive wires. Therefore, when the side printing process is performed on the electronic device to form the contacts between the conductive wires and the peripheral circuits, the short of the conductive wires may be reduced by the dam wall, thereby improving the quality of the electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
    a first substrate having a first surface and a first side-surface adjacent to the first surface;
    a second substrate having a second surface and a second side-surface adjacent to the second surface;
    a plurality of first conductive wires disposed on the first surface;
    a plurality of dam walls disposed on the first surface and located between any adjacent two of the first conductive wires respectively, wherein one of the first conductive wires is partially overlapped with adjacent two of the dam walls, and a portion of a top surface of the one of the first conductive wires is exposed by the adjacent two of the dam walls; and
    a plurality of second conductive wires disposed on the first side-surface and the second side-surface,
    wherein the plurality of first conductive wires are electrically connected to the plurality of second conductive wires respectively,
    wherein one of the second conductive wires has a portion protruded from the first side-surface and the second side-surface and another portion sandwiched between the adjacent two of the dam walls and directly in contact with the portion of the top surface of the one of the first conductive wires, and a width of the portion of the one of the second conductive wires is greater than a maximum width of the another portion of the one of the second conductive wires.

2. The electronic device of claim 1, wherein a distance between adjacent two of the plurality of dam walls is less than a width of one of the plurality of second conductive wires.

3. The electronic device of claim 1, wherein a thickness of each of the plurality of dam walls is greater than a thickness of each of the plurality of first conductive wires.

4. The electronic device of claim 1, wherein each of the plurality of dam walls comprises an insulating material.

5. The electronic device of claim 1, further comprising a first functional layer disposed on the first surface and a second functional layer disposed on the second surface, wherein the plurality of dam walls are disposed between the first functional layer and the second functional layer.

6. The electronic device of claim 5, wherein the first functional layer comprises a plurality of driving elements.

7. The electronic device of claim 5, wherein the second functional layer comprises a black matrix.

8. The electronic device of claim 1, further comprising a dam bar disposed on the first surface and extending across the plurality of first conductive wires, wherein a gap is formed between the plurality of dam walls and the dam bar.

9. The electronic device of claim 1, further comprising a color filter layer disposed on the second substrate and comprising a plurality of color filters, wherein the plurality of dam walls are disposed corresponding to the plurality of color filters respectively.

10. The electronic device of claim 9, wherein the plurality of color filters are not overlapped with the plurality of first conductive wires in a top view direction of the electronic device.

11. The electronic device of claim 9, wherein the plurality of color filters are at least partially overlapped with the plurality of first conductive wires in a top view direction of the electronic device.

12. The electronic device of claim 1, wherein the portion of the one of the second conductive wires contacts the first side surface and the second side surface.

13. The electronic device of claim 1, wherein the another portion of the one of the second conductive wires is overlapped with the first substrate and the second substrate.

* * * * *